US006864999B1

(12) United States Patent
Fujimoto et al.

(10) Patent No.: US 6,864,999 B1
(45) Date of Patent: Mar. 8, 2005

(54) INTEGRATED IMAGE-READING/WRITING HEAD AND IMAGE PROCESSING APPARATUS INCORPORATING THE SAME

(75) Inventors: Hisayoshi Fujimoto, Kyoto (JP); Hiroaki Onishi, Kyoto (JP); Toshihiko Takakura, Kyoto (JP); Norihiro Imamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/743,519

(22) PCT Filed: Jul. 12, 1999

(86) PCT No.: PCT/JP99/03770

§ 371 (c)(1),
(2), (4) Date: Jan. 11, 2001

(87) PCT Pub. No.: WO00/03537

PCT Pub. Date: Jan. 20, 2000

(30) Foreign Application Priority Data

| Jul. 13, 1998 | (JP) | ............................................. 10/197332 |
| Jul. 16, 1998 | (JP) | ............................................. 10/201809 |
| Jul. 24, 1998 | (JP) | ............................................. 10/209434 |

(51) Int. Cl.⁷ .......................... H04N 1/024; H01L 23/02
(52) U.S. Cl. ........................ 358/472; 358/483; 358/496
(58) Field of Search .............................. 358/472, 483, 358/473, 496, 498, 482, 474, 401, 501, 505, 514, 513, 512; 382/312, 318; 250/208.1, 234–236, 227.2, 216, 239; 347/256, 241; 257/678, 680, 431–434, 724, 730; 399/144, 211

(56) References Cited

U.S. PATENT DOCUMENTS

| 4,466,020 A | 8/1984 | O'Connell | ................... 358/482 |
| 4,868,669 A | 9/1989 | Miyazawa | ................... 358/400 |
| 5,570,122 A | 10/1996 | Imamura et al. | ............ 347/171 |
| 5,579,114 A | * 11/1996 | Imamura | ..................... 358/482 |
| 5,780,840 A | * 7/1998 | Lee et al. | ................. 250/208.1 |
| 6,014,231 A | * 1/2000 | Sawase et al. | .............. 358/482 |
| 6,166,832 A | * 12/2000 | Fujimoto | .................... 358/484 |
| 6,222,581 B1 | * 4/2001 | Fujimoto et al. | ........... 347/256 |
| 6,295,141 B1 | * 9/2001 | Ogura et al. | ............... 358/475 |
| 6,448,995 B1 | * 9/2002 | Fujimoto et al. | ........... 347/241 |
| 6,469,808 B1 | * 10/2002 | Onishi et al. | ............... 358/475 |

FOREIGN PATENT DOCUMENTS

| JP | 4-282952 | 10/1992 | .......... H04N/1/024 |
| JP | 6-70090 | 3/1994 | .......... H04N/1/024 |
| JP | 6-86004 | 3/1994 | .......... H04N/1/024 |
| JP | 6-113069 | 4/1994 | .......... H04N/1/024 |
| JP | 9-284470 | 10/1997 | .......... H04N/1/024 |
| JP | 10-51587 | 2/1998 | .......... H04N/1/024 |
| WO | WO 98 05158 A | 2/1998 | .......... H04N/1/024 |

\* cited by examiner

*Primary Examiner*—Cheukfan Lee
(74) *Attorney, Agent, or Firm*—Michael D. Bednarek; Shaw Pittman LLP

(57) ABSTRACT

An integrated image-reading/writing head A comprises an oblong rectangular substrate (4) having a first longitudinal edge portion (4c), a second longitudinal edge portion (4d) and a surface (4a) mounted with an array of light receiving elements (2) and an array of drive IC's (80). The surface (4a) of the substrate (4) is fitted with an oblong case (1) enclosing therein the light receiving elements (2) and the drive IC's (80). The first longitudinal edge portion (4c) of the substrate (4) is extended out of the case by a predetermined width. The surface (4a) of the substrate (4) is further mounted with a light source (3) enclosed within the case (1). A plurality of heating elements (8) are mounted on a region of the surface (4a) of the substrate (4) extended out of the case (1).

23 Claims, 24 Drawing Sheets

INTEGRATED IMAGE-READING/WRITING HEAD AND IMAGE PROCESSING APPARATUS INCORPORATING THE SAME

TECHNICAL FIELD

The present invention relates to an integrated image-reading/writing head having both image reading capability and image forming capability, and an image processing apparatus incorporating the same.

BACKGROUND ART

An image processing apparatus such as a facsimile machine has to have both image reading capability and image forming capability, and further has to meet requirement for a smaller size of the image processing apparatus. With this background, there is already made a proposal that an integrated image-reading/writing head capable of performing both image reading and image forming should be incorporated in the image processing apparatus. An integrated image-reading/writing head of this kind has a constitution as shown in FIG. 24 for example. The integrated image-reading/writing head X shown in this figure comprises a case 1A having an upper opening 10A fitted with a transparent cover 19A. Inside the case 1A, there is a light source 3A for illuminating a reading line L provided on the transparent cover 19A. Further downward in the case 1A, an oblong rectangular substrate 4A is disposed. The substrate 4A has a first surface 40A and a second surface 40B respectively mounted with a plurality of light receiving elements 2A and a plurality of heating elements 8A, linearly and longitudinally of the substrate.

According to the image processing apparatus incorporating the integrated image-reading/writing head X constituted as above, a document D is contacted onto the transparent cover 19A and fed by rotation of a first platen roller P1 serving as a document feeding roller. During this process, the document D is illuminated by light from the light source 3A. Reflected light from the document D is focused by a lens 5A disposed between the reading line L and each of the light receiving elements 2A, forming an image of the document D onto the array of the light receiving elements 2A. Thus, an image data of the document D can be obtained in each of the light receiving elements 2A. On the other hand, a recording paper K is contacted onto each of the heating elements and fed by rotation of a second platen roller P2 serving as a recording-paper feeding roller. During this process, appropriate ones of the heating elements 8A are selected based on data of an image to be recorded in the recording paper K, and the selected heating elements 8A are heated to form an image in the recording paper K.

According to the integrated image-reading/writing head X arranged as described above, the light receiving elements 2A are mounted on the first surface 40A of the substrate 4 whereas the heating elements 8A are mounted on the second surface 40B of the substrate 4A, resulting in the following problems.

Specifically, first, when mounting the light receiving elements 2A and the heating elements 8A on the substrate 4A, the light receiving elements 2A are mounted first on the first surface 40A of the substrate 4A for example, and then the substrate 4A must be turned over in order to mount the heating elements 8A on the second surface 40B of the substrate 4A. As exemplified, in order to carry out necessary steps to the substrate 4A, operations must be performed to each of the first surface 40A and the second surface 40B of the substrate 4A at very much lower operation efficiency as compared to a case in which operations are performed to only one surface of the substrate 4A.

Second, according to the integrated image-reading/writing head X, the document D is fed while being tightly contacted onto the transparent cover 19A fitted into the opening 10A of the case 1A whereas the recording paper K is fed while being tightly contacted onto each of the heating elements 8A mounted on the second surface 40B of the substrate 4A. Specifically, according to the image processing apparatus incorporating the integrated image-reading/writing head X, the platen roller P1 for feeding the document is disposed above the integrated image-reading/writing head X whereas the platen roller P2 for feeding the recording paper is disposed below the integrated image-reading/writing head X. Therefore, in this image processing apparatus, due to the disposition of the platen rollers P1, P2, it is difficult to reduce an overall size of the image processing apparatus by decreasing a vertical dimension.

It is therefore an object of the present invention to improve manufacturing efficiency of the integrated image-reading/writing head, and to make possible to reduce the size of the image processing apparatus.

DISCLOSURE OF THE INVENTION

An integrated image-reading/writing head provided by a first aspect of the present invention comprises:

an oblong rectangular substrate having a first longitudinal edge portion, a second longitudinal edge portion and a surface mounted with an array of light receiving elements;

an oblong case mounted on said surface, enclosing the light receiving elements;

a transparent cover attached to the case, facing the substrate and tightly contacted by a document being fed;

a light source disposed within the case for illuminating the document;

a lens disposed within the case for focusing an image of the document illuminated by the light source on the light receiving elements;

an array of heating elements mounted on the substrate; and a plurality of drive IC's each driving a predetermined number of the heating elements; and is characterized in that the first longitudinal edge portion is extended out of the case by a predetermined width; and that the heating elements are mounted on a region of said surface extended out of the case of said surface.

According to this integrated image-reading/writing head, each of the light receiving elements and the heating elements are mounted on a same single surface of the substrate. In other words, according to this integrated image-reading/writing head, operations necessary for mounting the light receiving elements and the light emitting elements are performed only to one same surface of the substrate. Therefore, differing from manufacture of the prior-art integrated image-reading/writing head, there is no longer the need for first mounting the light receiving elements on one surface of the substrate, then turning the substrate over, and then mounting the light emitting elements on the other surface of the substrate. As a' result, according to the integrated image-reading/writing head having the above described constitution, manufacturing efficiency of the integrated image-reading/writing head can be improved over that of the prior art.

According to a preferred embodiment, the light source is mounted on said surface.

With the above constitution, there is no need for providing the second substrate separately from the substrate mounted with the light receiving elements and the light emitting elements, and this offers a cost advantage. Further, the light source is mounted on the same surface of the substrate as mounted with each of the light receiving elements and the light emitting elements. Therefore, steps in manufacturing the integrated image-reading/writing head can be simplified.

According to the preferred embodiment, further, the light source is mounted closer to a longitudinal edge of the second longitudinal edge portion than is the array of the light receiving elements in said surface.

According to the preferred embodiment, further, the light source is mounted between the array of the heating elements and the array of the light receiving elements in said surface.

According to the preferred embodiment, further, the drive IC's are mounted on said surface at an interval in an array extending longitudinally of the substrate.

With this arrangement, each of the drive IC's is mounted on the same single surface of the substrate as mounted with the light receiving elements and the light emitting elements. Therefore, steps in manufacturing the integrated image-reading/writing head can be further simplified.

According to the preferred embodiment, further, the light source includes a plurality of light source elements.

According to the preferred embodiment, further, a part of the light source elements are mounted in each of the intervals between the drive IC's in said surface.

A region on the substrate between a pair of mutually adjacent IC's is generally a blank space. According to the integrated image-reading/writing head having the above constitution, the blank space in the substrate is mounted with at least a part of the light sources. Therefore, space in the single surface of the substrate can be utilized efficiently. Efficient utilization of the single space of the substrate such as above offers advantages such as reduction in a widthwise dimension of the substrate. This advantage provides greater benefit when the number of light source elements mounted on the above region increases.

According to the preferred embodiment, further, two or more of the light source elements are mounted in each of the intervals between the drive IC's in said surface, and the two or more of the light source elements are connected electrically in series.

Again, according to this particular arrangement, the blank space between the mutually adjacent IC's is utilized, making possible to reduce the widthwise dimension of the substrate.

According to the preferred embodiment, further, said surface is formed with a power supply wiring pattern for supply of electric power to each of the light receiving elements and the light source.

According to this constitution, the wiring for supplying driving power to each of the light receiving elements is common to the wiring for supplying driving power to the light source. As a result, there is no need for providing a separate wiring for driving the light receiving elements from the wiring for driving the light source. This offers such an advantage that the wiring to be formed on the substrate can be simplified, and the width of the substrate can be reduced accordingly.

An element generally utilized as the light source element is an LED chip, and a driving voltage of a commonly used LED chip is slightly lower than 2 V. The light receiving elements is usually provided as a sensor IC chip in which a predetermined number of light receiving elements are grouped, and there is such a sensor IC chip which can be driven at a driving voltage of about 5 V. Therefore, if two or three LED chips each having a driving voltage of slightly less than 2 V are connected in series, these LED chips can be driven at about 5 V. Thus, if the sensor IC chip having a driving voltage of about 5V is combined with these LED chips each having a driving voltage of slightly less than 2 V, each of the light source elements and the light receiving elements can be driven by the same power source.

According to the preferred embodiment, further, the power supply wiring pattern formed on said surface extends longitudinally of the substrate along the array of the light receiving elements, and said surface is further formed with a grounding wiring pattern for the drive IC's longitudinally of the substrate along the power supply wiring pattern.

Further, at least a part of the light source elements are mounted on a region between the power supply wiring pattern and the grounding wiring pattern.

Ideally, the power line and the grounding line should be formed as widely as possible in view of electrical resistance. However, even if these wirings are formed slightly narrower, the electrical resistance in these wirings does not grow so large as to a problematic extent. Therefore, it is possible to slightly narrow the power supply wiring and the grounding wiring thereby reserving a region between these wirings for mounting the light source elements. With such an arrangement as this, even if the light source elements are mounted on the same substrate as the light receiving elements and other components, the region for mounting the light source elements can be reserved without increasing the width of the substrate.

According to the preferred embodiment, further, at least a part of the light source elements are mounted directly on the grounding wiring.

Generally, the light source element such as the LED chip has an upper surface formed with a positive electrode, and a lower surface formed with a negative electrode. Thus, when a plurality of the LED chips are electrically connected in series, the connection must be made so that the power is supplied first to an LED placed at an electrically most upstream position, and then sequentially to the LED chips placed at downstream positions. In this connecting pattern, the negative electrode of the LED disposed at the electrically most downstream position must be electrically connected to the grounding wire. Therefore, the LED chip (the light source element) disposed at the electrically most downstream position can be mounted right on the grounding wire with the LED's negative electrode being used as a mounting surface. In this case, part of the grounding wiring is used as a region for mounting the light source element. Therefore, even if the light source elements are mounted on the same substrate as mounted with the light receiving elements and other components, the region for mounting the light source elements can be reserved without increasing the width of the substrate.

An image processing apparatus provided by a second aspect of the present invention comprises: the integrated image-reading/writing head according to claim 1;

a first platen roller pressing the transparent cover and feeding the document under tight contact onto the transparent cover;

a second roller pressing the array of the heating elements and feeding a recording paper under tight contact onto the array of the heating elements.

According to the integrated image-reading/writing head incorporated in the image processing apparatus of the above constitution, the light receiving elements and the heating elements are mounted on a same single surface of the substrate, and the case is attached to the same single surface. Since the transparent cover is attached to this case, according to the image processing apparatus incorporating the image processing apparatus of the above constitution, the first platen roller and the second platen roller are disposed on a same side of the substrate. Therefore, the thickness of the image processing apparatus can be remarkably reduced as compared to the prior art image processing apparatus in which one platen roller is disposed on each side of the substrate, with the substrate in between.

According to a preferred embodiment, the integrated image-reading/writing head is incorporated in a predetermined box.

According to the preferred embodiment, further, the box is formed with an opening for exposure of inside of the box, and a lid member capable of closing the opening.

According to the above constitution, inside of the box is exposed when the opening is opened. Therefore, repairs and replacement of parts and components incorporated in the box, loading of the recording paper, and removing a stuck sheet of document or recording paper can be easily performed.

According to the preferred embodiment, further, the opening exposes the integrated image-reading/writing head when opened, and the integrated image-reading/writing head is pivotable about an axis extending longitudinally of the substrate.

The recording paper can be a cut sheet of paper or a continuous ribbon of paper. If the continuous ribbon is used for example, the paper is disposed as a roll of paper within the image processing apparatus. Since the roll paper is often disposed near the integrated image-reading/writing head, and particularly close to the heating elements, according to the arrangement in which the integrated image-reading/writing head is exposed when the opening is exposed, replacement of the roll paper can be easily made once the opening is exposed by operating the lid member. Further, even if an arrangement is such that the roll paper is made inaccessible by the integrated image-reading/writing head when the opening is exposed, as far as the integrated image-reading/writing head is pivotable when the opening is exposed, replacement of the roll paper can be easily made once the integrated image-reading/writing head is pivoted for example.

Further, stacking of the document or the recording paper usually happens near the integrated image-reading/writing head in the image processing apparatus. Therefore, if the integrated image-reading/writing head is pivotable when the opening is exposed, the stacking of the paper can also be serviced easily.

According to the preferred embodiment, further, the above axis is provided by a rotating shaft of the second platen roller.

According to the above arrangement, there is no need for separately providing a pivotal shaft for pivoting the integrated image-reading/writing head, and there is an advantage in term of cost and of layout within the box.

According to the preferred embodiment, further, the first longitudinal edge portion of the substrate is provided with retaining means having an insertion portion projecting toward the second platen roller and loosely holding the rotating shaft of the second platen roller.

According to the above arrangement, the integrated image-reading/writing head can be pivotable once the integrated image-reading/writing head is assembled into the box with the shaft inserted into the insertion portion.

According to the preferred embodiment, still more, the image processing apparatus further comprises pressing force adjusting means adjusting each of a pressing force of the first platen roller onto the transparent cover and a pressing force of the second platen roller onto the heating elements when the opening is closed.

According to the integrated image-reading/writing head described above, printing is made by means of a thermosensible method or a thermal-transfer method in which image formation is achieved by heating selected heating elements. In the image processing apparatus which incorporates such an integrated image-reading/writing head as the above, in order to achieve an appropriate image formation, the recording paper must be pressed to each of the heating elements at a relatively large force (at 2 kgf for example). On the other hand, if the document is pressed to the transparent cover at an excessive force at the time of feeding, problems such as a scratched transparent cover will result. Thus, the force for pressing the document to the transparent cover may not be as large as the force for pressing the recording paper to the array of the heating elements, and can be about 0.5 kgf for example. As exemplified as above, the pressure to the transparent cover provided by one of the platen rollers and the pressure to the array of the heating elements provided by the other of the platen rollers should preferably be differentiated from each other rather than being the same. Therefore, there is much significance in the provision of the pressing force adjusting means.

According to the preferred embodiment, further, the pressing force adjusting means includes a pressing member pressing the substrate to the first platen roller and the second platen roller.

According to the preferred embodiment, further, two of the pressing members are disposed widthwise of the substrate for pressing each of the first longitudinal edge portion and the second longitudinal edge portion of the substrate.

With the above arrangement, by appropriately selecting a material, size (length and diameter) or hardness (elasticity, etc.) and so on for each of the pressing member for pressing the first longitudinal edge portion and the pressing member for pressing the second longitudinal edge portion, it becomes possible to achieve a desired amount of pressing force to each of the first longitudinal edge portion and the second longitudinal edge portion.

According to the preferred embodiment, further, only one of the pressing member is disposed widthwise of the substrate for pressing a predetermined region of the substrate for distribution of the pressing force to each of the longitudinal edges of the substrate at a desired ratio.

With this arrangement, the ratio between the pressing force to the first longitudinal edge portion and the pressing force to the second longitudinal edge portion is determined by selecting a pressing region widthwise of the substrate. On the other hand, an amount of force to press the first longitudinal edge portion and the second longitudinal edge portion is determined by appropriately selecting a material, size (length and diameter) or hardness (elasticity, etc.) and so on of the pressing member.

According to the preferred embodiment, further, the pressing member is made of an elastic member.

The elastic member can be a spring such as a spiral spring and a leaf spring, or an elastomer such as rubber, urethane, foamed plastic and so on.

There is no limitation to the number of pressing members disposed longitudinally of the substrate, and thus a single pressing member or a plurality of the members can be used.

According to the preferred embodiment, further, the integrated image-reading/writing head is attached to the lid member.

With this arrangement, once the lid member is operated to expose the opening, the integrated image-reading/writing head is already removed from the box. Thus, the same advantages can be enjoyed as in the arrangement in which the integrated image-reading/writing head is pivotable. These advantages include easy replacement and repair of parts and components, replacement of roll paper, as well as removing a stuck piece of paper.

BEST MODE FOR CARRYING OUT THE INVENTION

Figure 1:
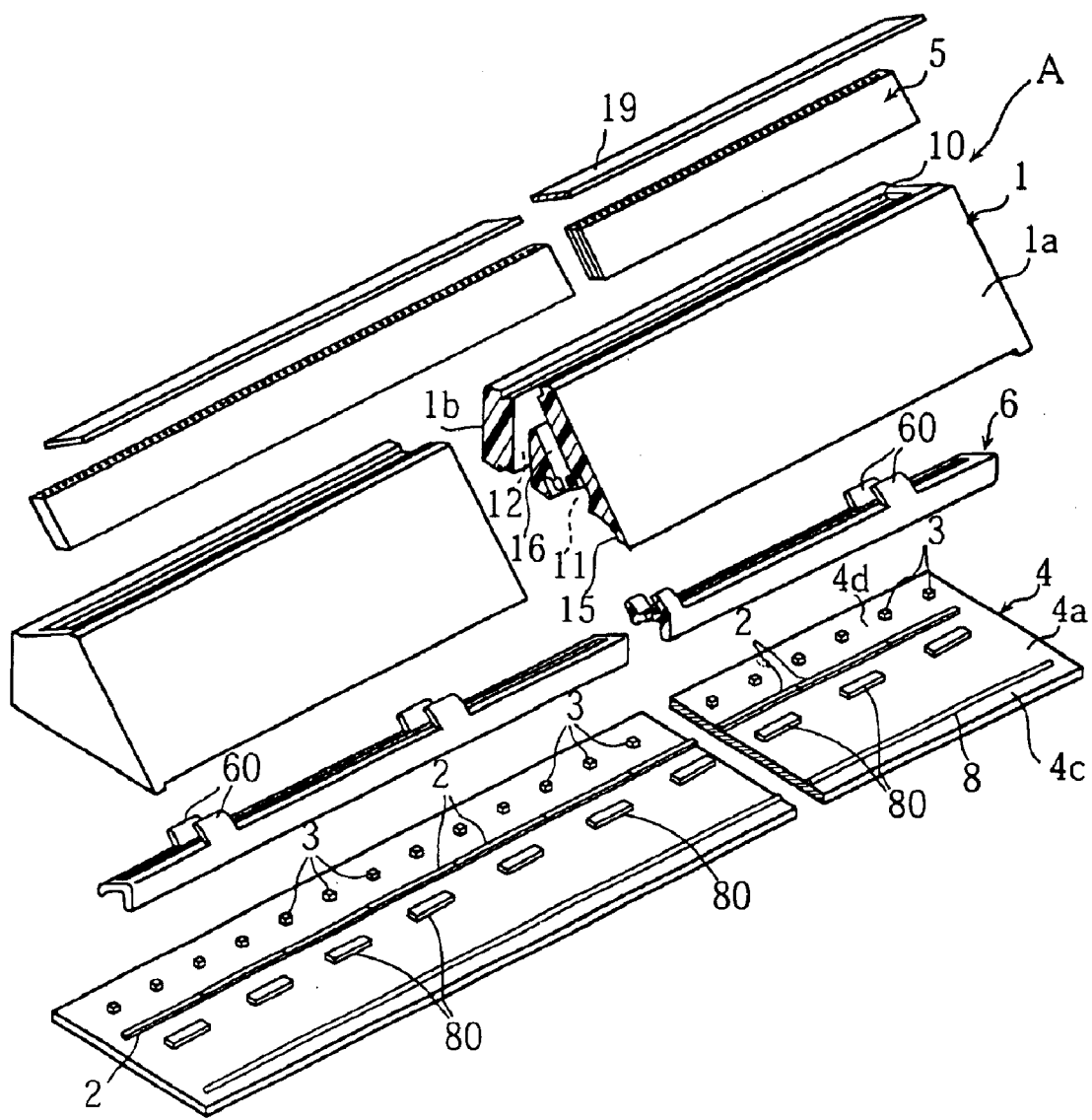
FIG. 1 is an exploded perspective view of an integrated image-reading/writing head as a first embodiment of the present invention.
Figure 10:
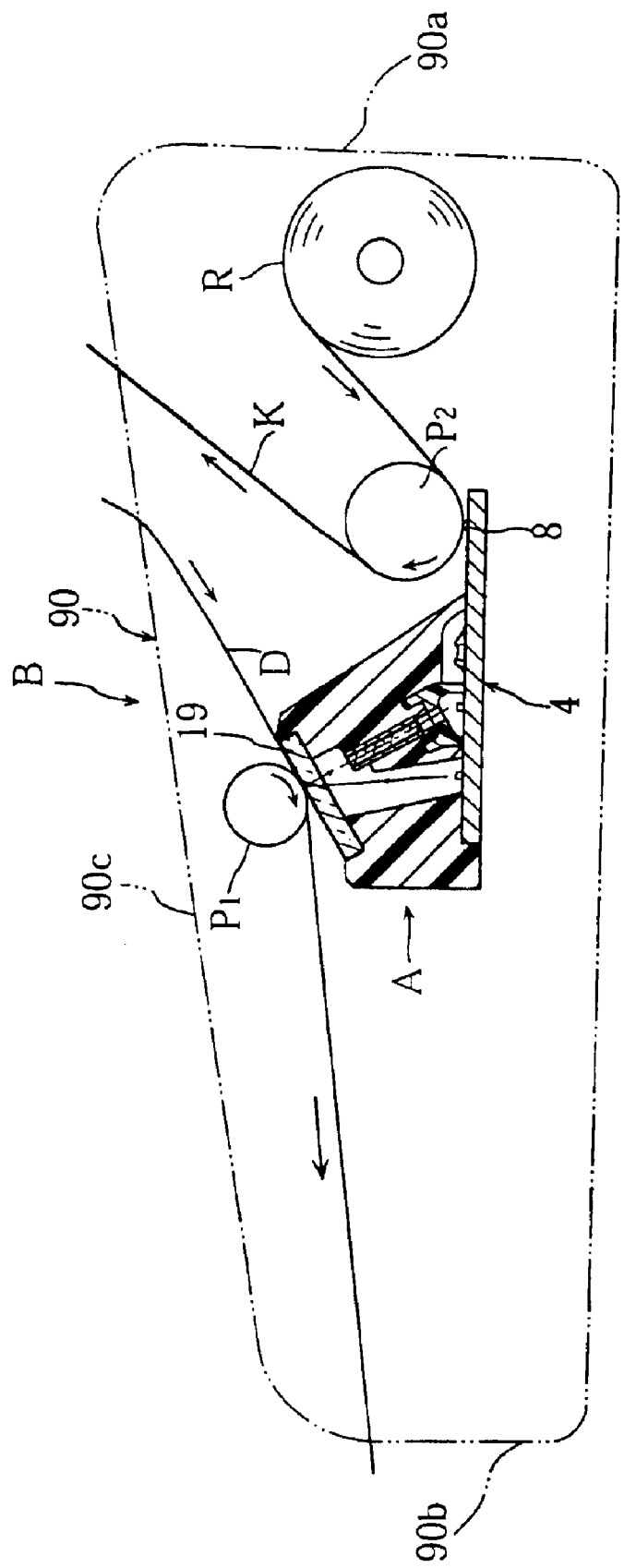
FIG. 10 is a conceptual diagram showing a longitudinal section of an image processing apparatus as a sixth embodiment of the present invention.

FIG. 1 and FIG. 10 show a constitution of an integrated image-reading/writing head 1 as a first embodiment of the present invention.

This integrated image-reading/writing head A comprises a substrate 4, case 1, a transparent cover 19, a lens array 5, and other parts, members and components to be described later.

The substrate 4 is made of a ceramic and formed into an oblong rectangle having a first longitudinal edge portion 4c and a second longitudinal edge portion 4d. The substrate 4 has an upper surface 4a mounted with a plurality of light source elements 3, a plurality of sensor IC chips 2, a plurality of drive IC's 80, and a plurality of heating elements.

Each of the light source elements 3 is provided by an LED chip for example, and mounted linearly and longitudinally of the substrate 4 at an appropriate interval in the second longitudinal edge portion 4d of the substrate 4.

Each of the sensor chips 2 is provided for example by a semiconductor chip including an integrally formed plurality of light receiving elements each having an individual light receiving surface. For example, if a document D of size A4 is to be read at a reading density of 8 dots/mm, a total of 1728 light receiving elements must be disposed. If one sensor IC chip 2 is formed with 96 light receiving elements, then a total of 18 sensor IC chips 2 must be prepared. These sensor IC chips 2 are placed in a row longitudinally of the substrate 4 in parallel to the row of the light source elements 3. It should be noted here that directions of the row of sensor IC chips 2 represents main scanning directions, and a pitch between two mutually adjacent light receiving elements represents a reading pitch in the scanning direction of the integrated image-reading/writing head A.

Each of the light receiving elements has a photoelectric transfer capability in which light received by the light receiving surface causes an output of a signal (image signal) having a level corresponding to an amount of the light received. Each of the sensor IC chips 2 incorporates electronic circuitry for serial output of the image signals coming from the light receiving elements in a predetermined sequence.

Each of the heating elements, though not clearly shown in the figures, is mounted in a row longitudinally of the substrate 4 along the first longitudinal edge portion 4c of the substrate 4. These heating elements are formed by electrically dividing a heating resistor 8 formed to extend longitudinally in the first longitudinal edge portion 4c of the substrate 4. The heating resistor 8 is formed for example by printing and baking a thick film of resistor paste including an electrically conducting component such as ruthenium oxide. The heating resistor 8 is electrically divided by forming a predetermined wiring pattern (not illustrated) on the upper surface 4a of the substrate 4.

Each of the drive IC's 80 controls heating action of assigned heating elements. The drive IC's 80 are mounted between the heating resistor 8 and the row of the sensor IC chips 2, in a row longitudinally of the substrate 4 at an appropriate interval.

Further, the upper surface 4a of the substrate 4 is formed with wiring patterns (not illustrated) respectively related to the light source elements 3, the sensor IC chips 2, heating elements, and drive IC's 80. Further, one or more connectors (not illustrated) electrically connected with the wiring patterns are provided at an appropriate location(s) of the substrate 4. By establishing wiring connection to this connector, power supply to each of the above described components as well as input and output of various signals to and from external components becomes possible.

The case 1 is made of a synthetic resin and has a length generally the same as that of the substrate 4. The case 1 is formed with an oblong rectangular upper opening 10, an oblong rectangular lower opening 15 and an inner space 12 communicating with these openings 10, 15. Further, inside the case 1, in addition to the inner space 12, there is also formed a fitting groove 16 communicating with the upper opening 10. Below the fitting groove 16, there is formed a space chamber 11 communicating with each of the fitting groove 16 and the lower opening 15. The case 1 has a slanted first side surface 1a, making a section of the case 1 increasingly small toward an upper portion of the case 1. Further, the first side surface 1a of the case 1 has a height higher than that of an opposing side surface 1b, making a surface of the upper opening slanted. The case 1 is assembled to the upper surface 4a of the substrate 4, with the first longitudinal edge portion 4c of the substrate 4 extended out of the case 1. Once the case 1 is assembled to the substrate 4, each of the light source elements 3 is in the inner space 12, whereas each of the sensor IC chips 2 and drive IC's 80 is in the space chamber 11. On the other hand each of the heating elements (heating resistor 8) is disposed out of the case 1, in the upper surface 4a of the substrate 4.

With the above arrangement, the case 1 is formed of a whity resin material such as polycarbonate containing titanium oxide. This resin material gives surfaces of the case 1 a high reflectance (from 97% to 98%). Thus, inner wall surfaces 12a, 12b of the inner space 12 can have the high reflectance.

The transparent cover 19 is to guide the document D which is the object of reading, and is formed as a plate of transparent glass or synthetic resin. A reading line L is provided in the main scanning directions on a surface of the transparent cover 19. The transparent cover 19 is assembled to the case 1 by fitting, for example, into the upper opening 10. Since the surface of the upper opening is slanted however, the transparent cover 19 is also slanted. More specifically, the transparent cover 19 is slanted so that the transparent cover has a lower height at a location closer to the second longitudinal edge portion 4d of the substrate 4.

The transparent cover 19 is illuminated by light. The light is emitted from each of the light source elements 3 and then reflected on each of the inner wall surfaces 12a, 12b of the inner space 12 of the case 1. Thus, if each of the inner wall surfaces 12a, 12b has a high reflectance, the light emitted from the light source 3 can be introduced efficiently onto the transparent cover 19 (the reading line L) by the reflection on each of the inner wall surfaces 12a, 12b at the high rate of reflection. With this arrangement, loss of the light coming from the light source 3 can be reduced.

The lens array 5 includes a plurality of rod lenses 51 held in a row by a block-like lens holder 50 extending in the main scanning directions. The lens array 5 has an upper surface facing the reading line L, and a lower surface facing the light receiving elements (the sensor IC chips 2), and is held by a fitting groove 16 of the case 1.

The lens array 5 focuses light reflected by the document D while the document is fed on the transparent cover 19, onto the array of the sensor IC chips 2. Thus, an image of the document D is formed on the light receiving elements in the sensor IC chips 2 without magnification nor inversion.

The space chamber 11 of the case 1 is provided with assisting members 6 surrounding the IC chips 2. Specifically, the assisting members 6 divide the space chamber 11 into a first space chamber 11a accommodating the sensor IC chips 2 and a second space chamber 11b accommodating the drive IC's 80. The assisting members 6 are made for example of an ABS resin containing a black pigment, which gives surfaces a high rate of light absorption. With a provision of the assisting members 6, it becomes possible to eliminate possibility that the light passing through the lens array 5 toward the sensor IC chips 2 reflects irregularly and diffuses around the sensor IC chips 2. The elimination of the diffusion caused by the irregular reflection of light around the sensor IC chips 2 makes possible to increase quality of the read image. The assisting members 6 have upper portions formed with projections 60, which are fitted into corresponding recesses 17 formed in the case 1, thereby assembling the assisting members to the case 1.

It should be noted here that such assisting members 6 as above may be replaced by another means. Specifically, the diffusion of the light can also be eliminated by forming a blackish coating, or applying a dark sheet or film and so on to inner surfaces surrounding the sensor IC chips 2.

Figure 3:
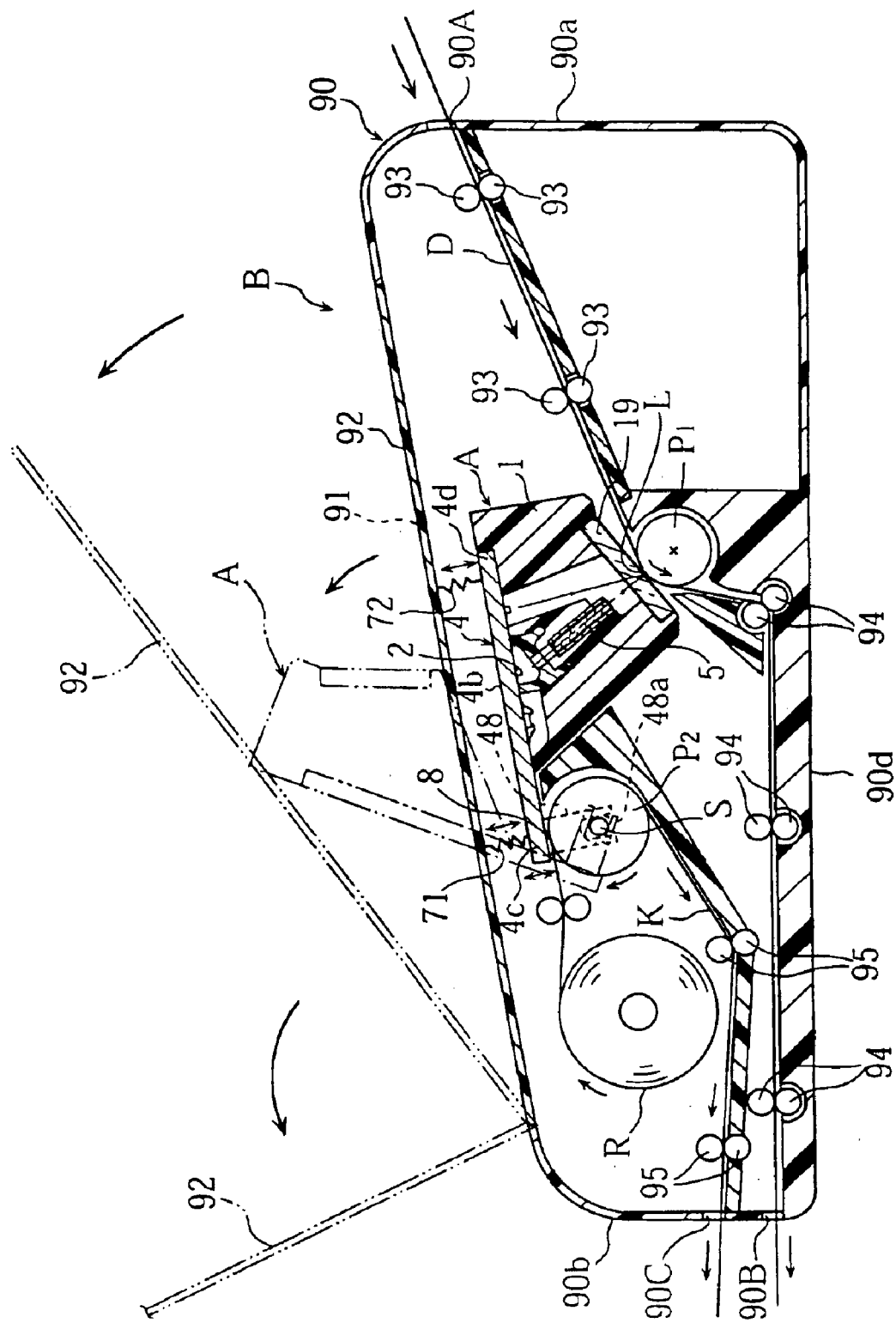
FIG. 3 is a view showing a longitudinal section of an image processing apparatus incorporating the integrated image-reading/writing head in FIG. 1.
Figure 4:
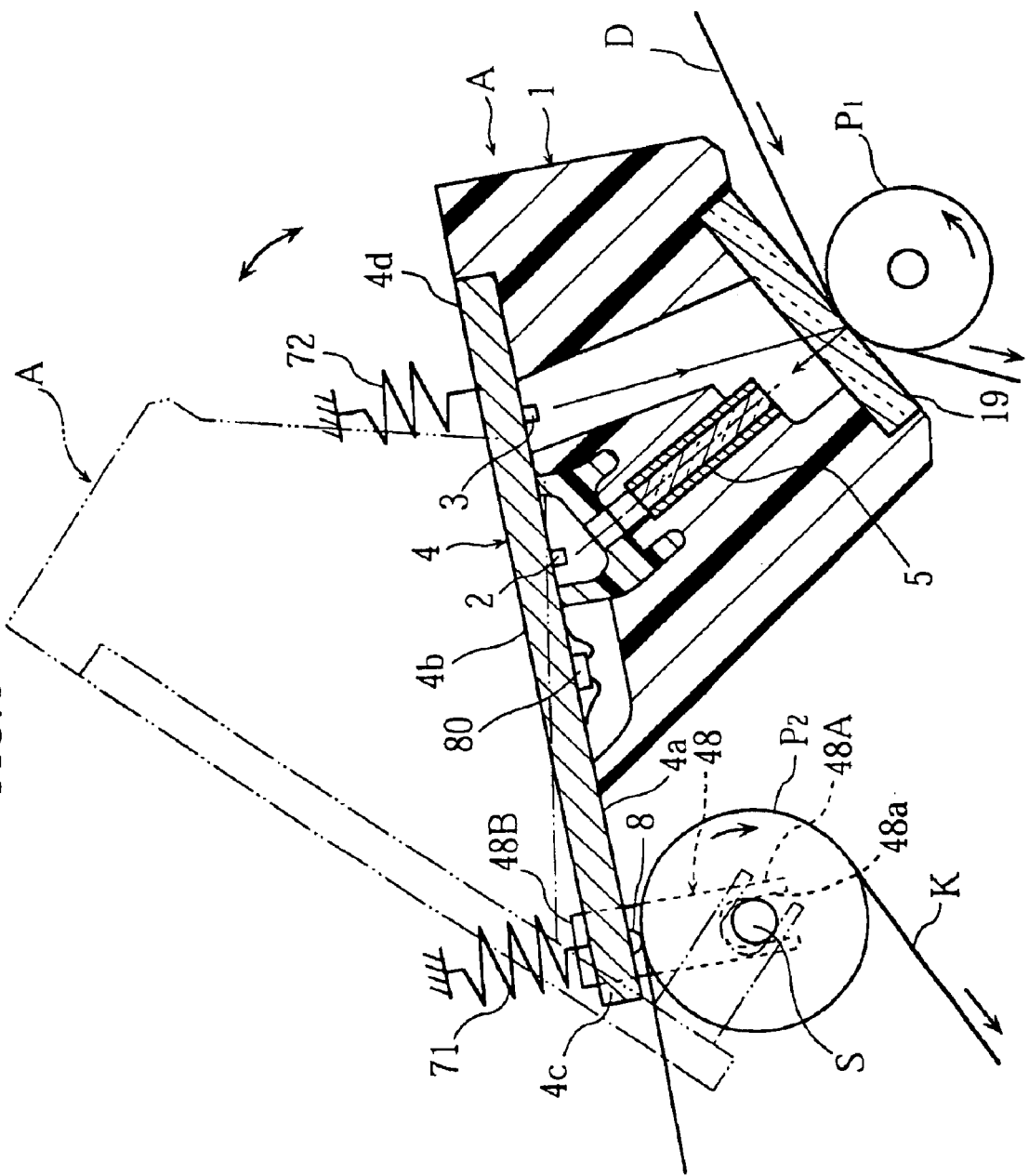
FIG. 4 is a sectional view of a principal portion of the image processing apparatus in FIG. 3 showing an arrangement around the integrated image-reading/writing head.
Figure 5:
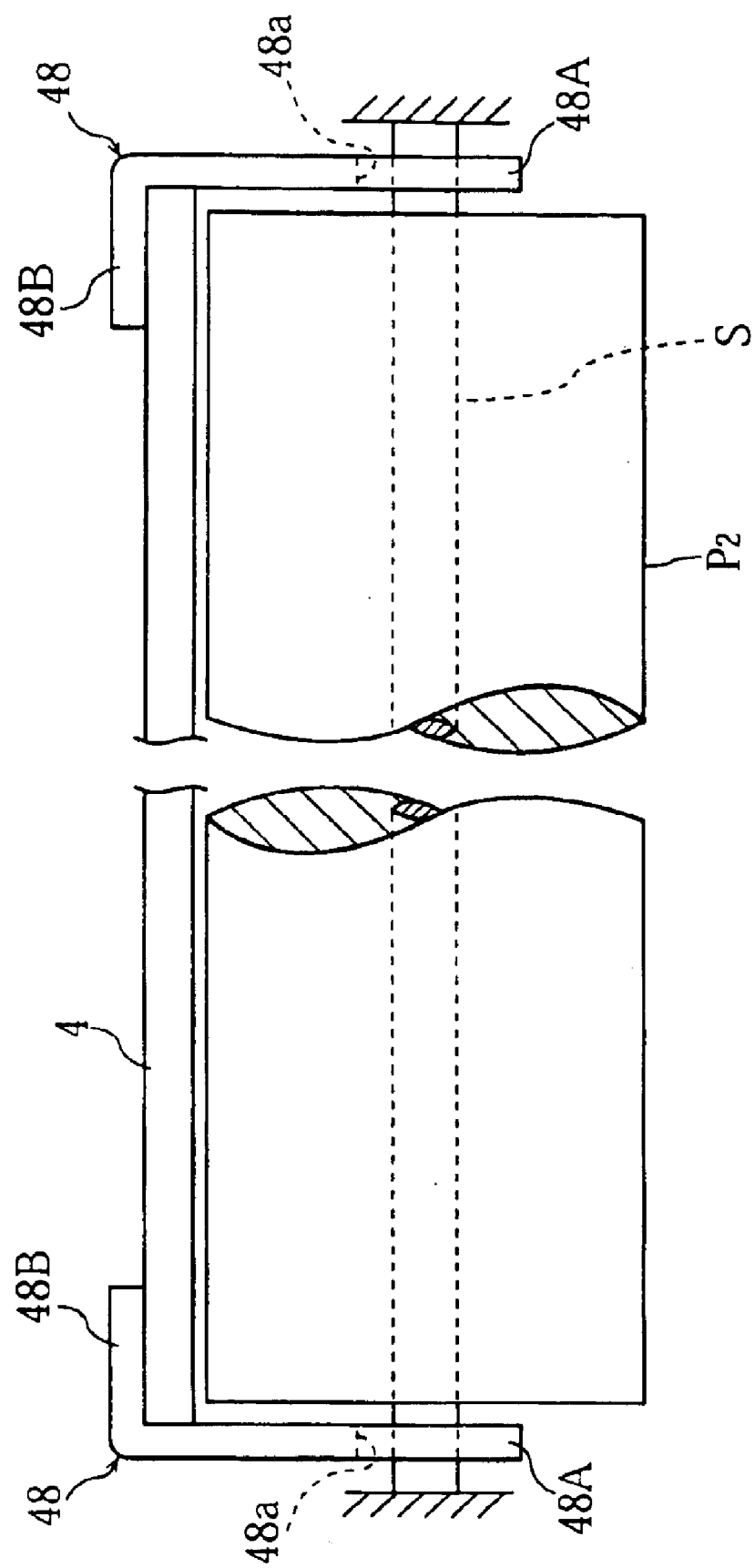
FIG. 5 is an enlarged view of a principal portion for description of a mounting structure of the integrated image-reading/writing head in the image processing apparatus in FIG. 3.

FIG. 3 shows an example of an image processing apparatus B incorporating the integrated image-reading/writing head A. FIG. 4 and FIG. 5 are enlarged views of principal portions of the image processing apparatus B respectively.

The image processing apparatus B comprises a box 90 made of a resin for example, in which the integrated image-reading/writing head A is incorporated.

As shown in FIG. 3, the box 90 has an upper portion formed with an opening 91. Further, the box 90 is provided with a lid member 92 selectively opened and closed, making possible to select from a state in which inside of the box 90 is accessible from the opening 91 (a state shown in phantom lines in FIG. 3) and a state in which the opening 91 is closed (a state shown in solid lines in FIG. 3). Further, the box 90 rotatably incorporates a first platen roller $P_1$ and a second platen roller $P_2$. The first platen roller $P_1$ is disposed to tightly contact the transparent cover 19 of the integrated image-reading/writing head A. The second platen roller $P_2$ is disposed to tightly contact the heating resistor 8 of the integrated image-reading/writing head A.

As clearly shown in FIG. 4 and FIG. 5, the integrated image-reading/writing head A is pivotable around a rotating shaft S of the second platen roller $P_2$ by means of two flange pieces 48 each provided at an end portion of the substrate 4.

The flange pieces 48 represent retaining means according to the present invention. Each of the flange pieces 48 is bent into a shape like a letter L, with a first end portion 48A formed with a cutout 48a. Each of the flange pieces 48 also has a second end portion 48B connected to the substrate 4. Each of the first end portions 48A of the flange pieces 48 projects from the substrate 4 toward the second platen roller $P_2$. With the above arrangement, the integrated image-reading/writing head A is incorporated within the box 90, with the rotating shaft S of the second platen roller $P_2$ loosely inserted into the cutouts 48a of the two flange pieces 48.

If no external force is applied to the integrated image-reading/writing head A, the integrated image-reading/writing head A is tightly contacted to each of the platen rollers $P_1$, $P_2$ only by a weight of its own. Under this state, according to the image processing apparatus B, the rotating shaft S of the second platen roller $P_2$ does not reach the deepest portion of either cutout 48 (See FIG. 4 and FIG. 5.) Because of this arrangement, the first longitudinal edge portion 4c of the substrate 4 of the integrated image-reading/writing head A can be moved away from the second platen roller $P_2$ and can be moved closer to the second platen roller $P_2$ until the rotating shaft reaches the deepest portion of each cutout 48a. In other words, the first longitudinal edge portion 4c of the substrate 4 is movable in directions of the thickness of the substrate 4. Since the integrated image-reading/writing head A is pivotable around the rotating shaft S of the second platen roller $P_2$, the second longitudinal edge portion 4d of the substrate 4 can be moved away from the first platen roller $P_1$. As has been understood, according to the image processing apparatus B, the substrate 4 (the integrated image-reading/writing head A) can be moved closer to and away from the platen rollers P1, P2 with regard to the first longitudinal edge portion 4c and the second longitudinal edge portion 4d respectively.

Alternatively, the first platen roller $P_1$ and/or the second platen roller $P_2$ maybe made vertically movable in the thickness directions of the substrate 4 (the image processing apparatus B), so that the first longitudinal edge portion 4c and/or the second longitudinal edge portion 4d of the substrate 4 is relatively movable closer to and away from the first platen roller $P_1$ and/or the second platen roller $P_2$.

According to the integrated image-reading/writing head A, since the first longitudinal edge portion 4c and the second longitudinal edge portion 4d of the substrate 4 is movable in the thickness directions of the substrate 4, a pressing force of the first platen roller $P_1$ onto the transparent cover 19 and a pressing force of the second platen roller $P_2$ onto the heating resistor 8 can be easily adjusted to a desired value by exerting a force externally from a surface (hereinafter called a "second surface 4b") of the substrate 4 away from the side on which the platen rollers $P_1$, $P_2$ are disposed. According to the present embodiment, as clearly shown in FIG. 3 and FIG. 4, two kinds of coil springs 71, 72 functioning as pressing members serve to adjust the pressing forces of the platen rollers $P_1$, $P_2$ acting on the transparent cover 19 and the heating resistor 8 respectively. It should be noted here that the pressing member may be alternatively provided by another elastic member than the coil spring, such as a leaf spring, or an elastomer such as rubber, urethane, foamed plastic and so on.

The coil springs 71, 72 are disposed in the following arrangement. Specifically, when the lid member 92 closes the opening 91 of the box 90, the coil spring 71 contacts the first longitudinal edge portion 4c of the substrate 4 whereas the other coil spring 72 contacts the second longitudinal edge portion 4d of the substrate 4. For example, each of the coil springs 71, 72 is provided integrally with the lid member 92 of the box 90, or integrally with the second surface 4b of the substrate 4. Each of the coil springs 71, 72 has a natural length larger than a distance between the substrate 4 and the lid member 92 when the opening 91 is closed by the lid member 92. Therefore, when the opening 91 is closed by the lid member 92, each of the coil springs 71, 72 is compressed into a length shorter than the natural length, between the substrate 4 and the lid member 92. As a result, the second surface 4b of the substrate 4 receives pressure generated by elastic returning forces of the coil springs 71, 72, pressing the integrated image-reading/writing head A onto each of the platen rollers $P_1$, $P_2$. According to the present arrangement, by appropriately selecting the length and a spring coefficient of each of the springs 71, 72, the forces acting on the first longitudinal edge portions 4c and the second longitudinal edge portions 4d of the substrate 4 can be easily adjusted respectively.

It should be noted here that the example shown in FIG. 3 to FIG. 5 only indicates that two kinds of coil springs 71, 72 are disposed widthwise of the substrate 4, and there is no specific limitation to the number of the coil springs 71, 72 disposed longitudinally of the substrate 4.

Next, function of the integrated image-reading/writing head A and the image processing apparatus B will be described with reference to FIG. 3.

According to the image processing apparatus B, the integrated image-reading/writing head A serves two functions of image reading and image recording. For example, reading of an image of the document D is made as follows. Specifically, the document D is put into a document feeding port 90A formed in a back surface 90a of the image processing apparatus B. The document D is then transported by paper feeding rollers 93 along a predetermined path and reaches a region provided with the first platen roller $P_1$. Then, the document D is held between the first platen roller $P_1$ and the transparent cover 19, and fed while being tightly contacted to the transparent cover 19 by a counterclockwise rotation, as in FIG. 3, of the first platen roller $P_1$ During the feeding, the reading line L is illuminated by the light from each of the light source elements 3. The light reflected by the document D is focused by the lens array 5 onto each of the sensor IC chips 2. Each of the sensor IC chips 2 outputs an analog signal of a level corresponding to an amount of light received. The signal is taken out of the integrated image-reading/writing head A from an unillustrated connector via a cable, completing one line in the reading of the image of the document D. The document D is fed by the platen roller $P_1$ in a direction of arrows in the figure intermittently line by line or continuously, and the above described reading sequence is repeated, eventually capturing the entire image of the document D. After the reading is complete, the document D is further fed by the paper feeding rollers 94, and discharged from a discharge port 90B formed in a front surface 90b of the image processing apparatus B.

On the other hand, when recording on the recording paper K, a roll of recording paper K (roll paper R) disposed in a front portion of the image processing apparatus B is transferred along a predetermined path and reaches a region provided with the second platen roller $P_2$. Then, the recording paper K is held between the second platen roller $P_2$ and the heating resistor 8, and fed while being tightly contacted to the heating resistor 8 by a clockwise rotation, as in FIG. 3, of the second platen roller $P_2$. During the feeding, each of the drive IC's 80 is supplied with image data from outside of the integrated image-reading/writing head A. Since the drive IC's are electrically connected with the above mentioned connector via a wiring pattern (not illustrated) formed in the substrate 4, the image data from outside is inputted to each of the drive IC's 80 through the cable, the connector and the wiring pattern. In accordance with the inputted data, each of the drive IC's 80 selects heating elements to be heated, and applies electric current to heat the selected heating elements, completing one line in the recording of the image to the recording paper K. The recording paper K is fed by the second platen roller $P_2$ in a direction of arrows in the figure intermittently line by line or continuously, and the above described recording sequence is repeated. The recording paper is further fed by the paper feeding rollers 95, and eventually discharged from a discharge port 90C formed in a front surface 90b of the image processing apparatus B.

As understood from FIG. 3 and FIG. 4, according the image processing apparatus B, both of the first platen roller $P_1$ and the second platen roller $P_2$ can be disposed on a side where the case 1 is attached. As a result, the three components, i.e. these two platen rollers $P_1$, $P_2$ and the integrated image-reading/writing head A can be disposed in a compact manner thickness-wise of the image processing apparatus B, making possible to reduce the thickness of the image processing apparatus B.

Further, according to the integrated image-reading/ writing head A, the side surface 1a of the case 1 facing the second platen roller $P_2$ is slanted. Therefore, a relatively large space can be reserved for the second platen roller $P_2$ in the region extending out of the substrate 4, i.e. on a side of the upper surface 4a of the first longitudinal edge portion 4c. This makes possible to appropriately dispose the second platen roller $P_2$ without requiring too much extension of the first longitudinal edge portion 4c of the substrate 4 out of the case 1. This provides a further advantage in an overall size reduction.

Further, since the transparent cover 19 is slanted, the first platen roller $P_1$ facing the transparent cover 19 can be sufficiently spaced from the second platen roller $P_2$. Therefore, unwanted mutual interference can be avoided even if diameters of the platen rollers P1, P2 are increased.

Now, the image reading operation and the image recording operation may be performed individually from each other; however, depending on constitution of the image processing apparatus B, these two operations can be performed simultaneously. In this case, feeding of the document by the first platen roller $P_1$ and the feeding of the recording paper by the second platen roller $P_2$ are performed simultaneously. This could cause such a problem that the document D and the recording paper K interfere with each other, disturbing smooth feeding of the document D and the recording paper K. However, according to the integrated image-reading/writing head A, sufficient distance is reserved between the first platen roller $P_1$ and the second platen roller $P_2$, and therefore such a problem as described above can be appropriately avoided.

Figure 6:
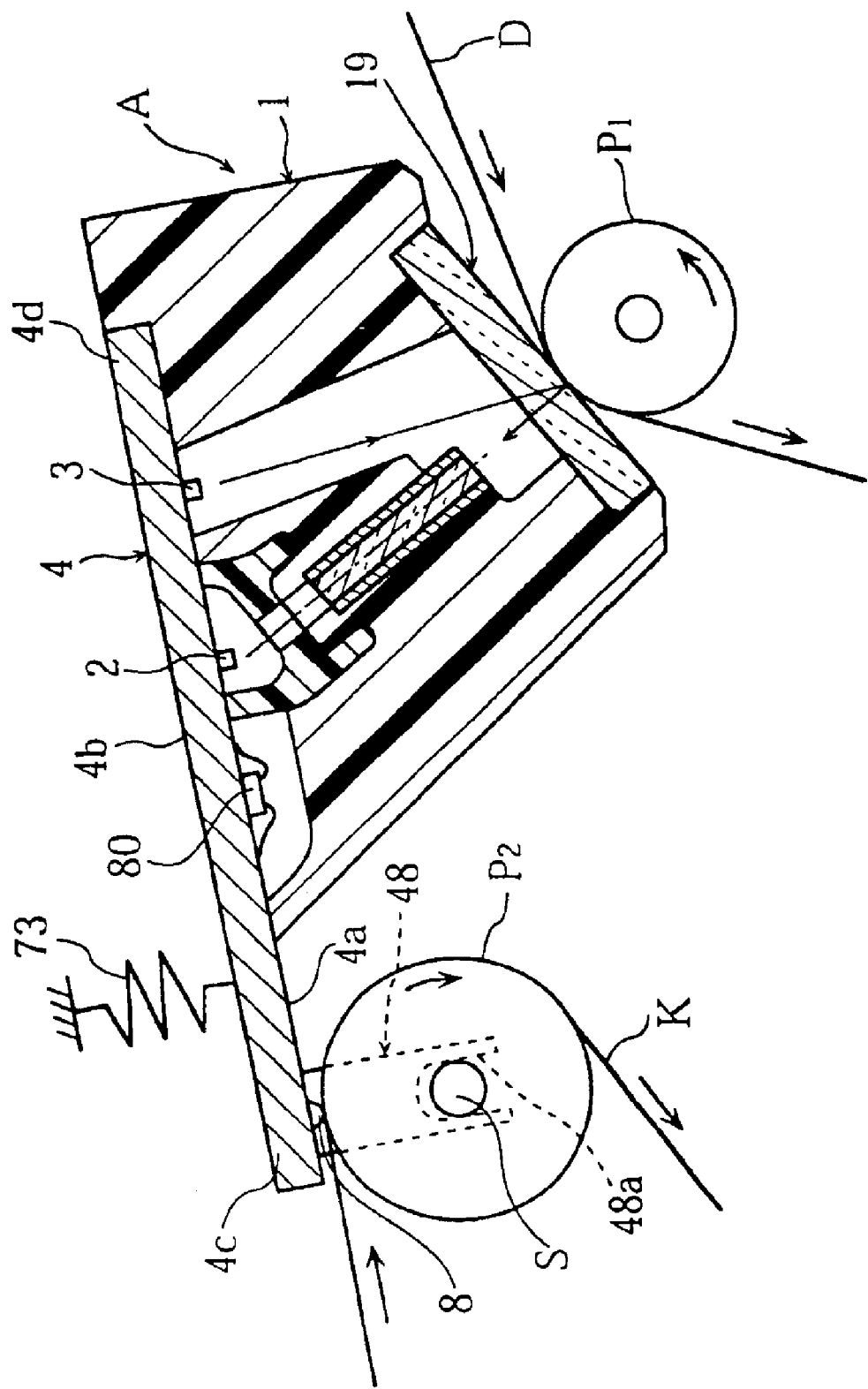
FIG. 6 is an enlarged sectional view of a principal portion of an image processing apparatus as a second embodiment of the present invention, showing an arrangement around the integrated image-reading/writing head.

It should be noted that according to the image processing apparatus B, the forces acting on the first longitudinal edge portion 4c and the second longitudinal edge portion 4d of the substrate 4 are adjusted by the two coil springs 71, 72 disposed widthwise of the substrate 4. Alternatively, as according to a second embodiment shown in FIG. 6, the forces acting on the first longitudinal edge portion 4c and the second longitudinal edge portion 4d of the substrate 4 may be adjusted by one coil spring 73 disposed widthwise of the substrate 4. In this case, ratio between the force acting on the first longitudinal edge 11 portion 4c and the force acting of the second longitudinal edge portion 4d in the substrate 4 can be adjusted by selecting a region in the second surface 4b of the substrate 4 to which the coil spring 73 is contacted. Further, by selecting a length and a spring coefficient of the coil spring 73, it becomes possible to adjust an amount of the force exerted to each of the first longitudinal edge portion 4c and the second longitudinal edge portion 4d of the substrate 4. It should be noted here that the rest of the arrangement in the second embodiment shown in FIG. 6 is identical with that of the first embodiment shown in FIG. 1 to FIG. 5.

Further, each of the platen rollers $P_1$, $P_2$, location of the roll paper R or the integrated image-reading/writing head A, the rotating direction of the roll paper and so on are not limited to those described in the embodiments so far as described above, and can be varied in many ways as exemplified in FIG. 7 to FIG. 13.

Figure 7:
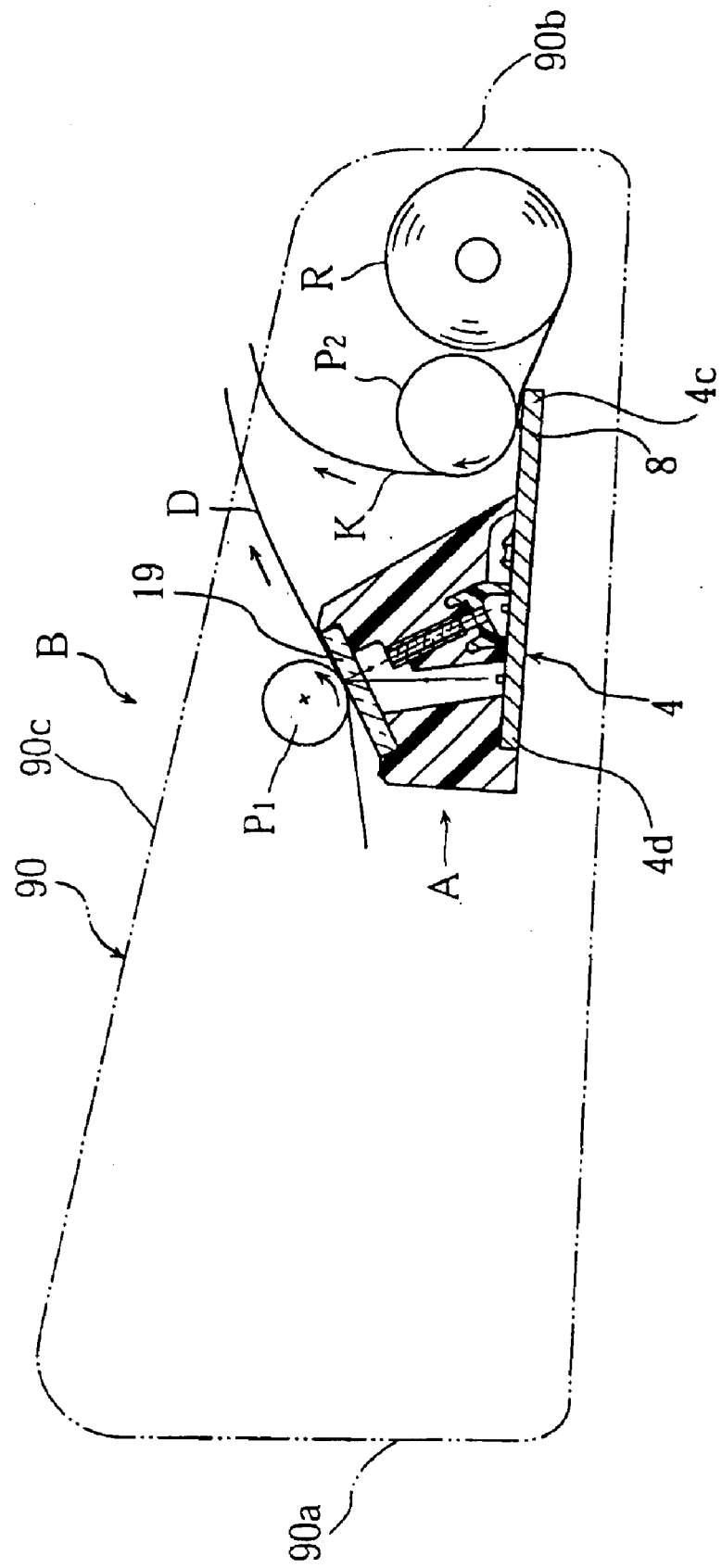
FIG. 7 is a conceptual diagram showing a longitudinal section of an image processing apparatus as a third embodiment of the present invention.

According to an image processing apparatus B as a third embodiment shown in FIG. 7, the integrated image-reading/ writing head A is incorporated in the box 90 in such an attitude that the case 1 projects from the substrate 4 toward the upper surface 90c of the box 90, and the extended portion (the first longitudinal edge portion 4c) of the substrate 4 projects toward the front surface 90b of the box 90. The first platen roller $P_1$ tightly contacts the transparent cover 19 rotatably in the counterclockwise direction as in FIG. 7, whereas the second platen roller $P_2$ tightly contacts the heating resistor 8 rotatably in the clockwise direction. Further, the roll paper R is disposed closer to the front surface 90b of the box 90 than is the integrated image-reading/writing head A or the second platen roller $P_2$, rotatably in the clockwise direction as in FIG. 7.

With the above arrangement, the recording paper K is pulled out on an underside of the roll paper R by the rotation of the first platen roller P1, formed with an image while passing between the first platen roller $P_1$ and the heating resistor 8, and then discharged from a port closer to a front end of the upper surface 90c of the box 90.

On the other hand, the document D is put from the back surface 90a of the box 90 or from a rear end portion of the upper surface 90c of the box 90. The document D is read while passing between the second platen roller $P_2$ and the transparent cover 19, and then discharged from a discharge port adjacent to the discharge port of the recording paper K in the upper surface 90c of the box 90.

Figure 8:
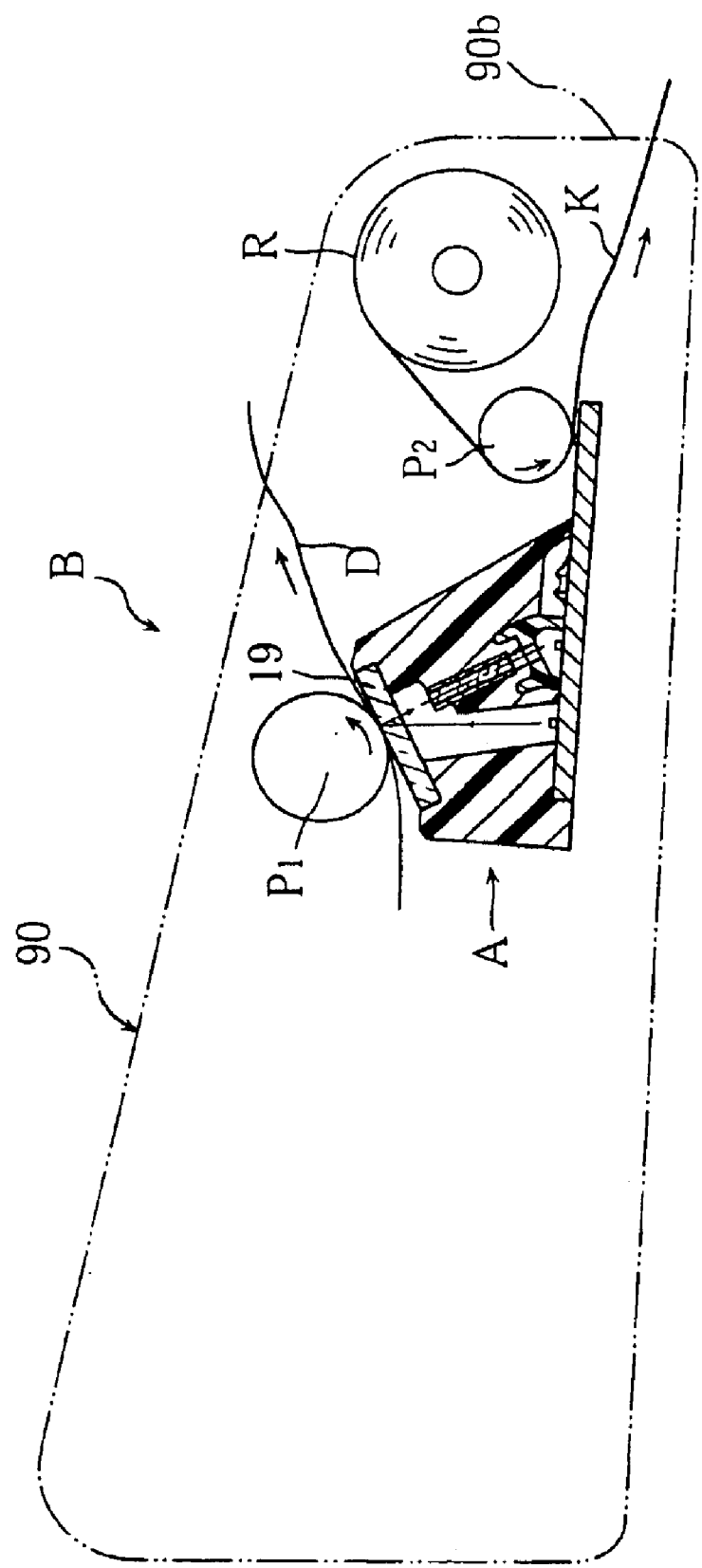
FIG. 8 is a conceptual diagram showing a longitudinal section of an image processing apparatus as a fourth embodiment of the present invention.

Further, according to a fourth embodiment shown FIG. 8, layout of the platen rollers $P_1$, $P_2$' the roll paper R and the integrated image-reading/writing head A is the same as in the third embodiment shown in FIG. 7, but the roll paper R and the second platen roller $P_2$ are rotated in the counterclockwise direction. With this arrangement, the recording paper K is pulled out from an upper side of the roll paper, and after formed with an image, discharged from the front surface 90b of the box.

Figure 9:
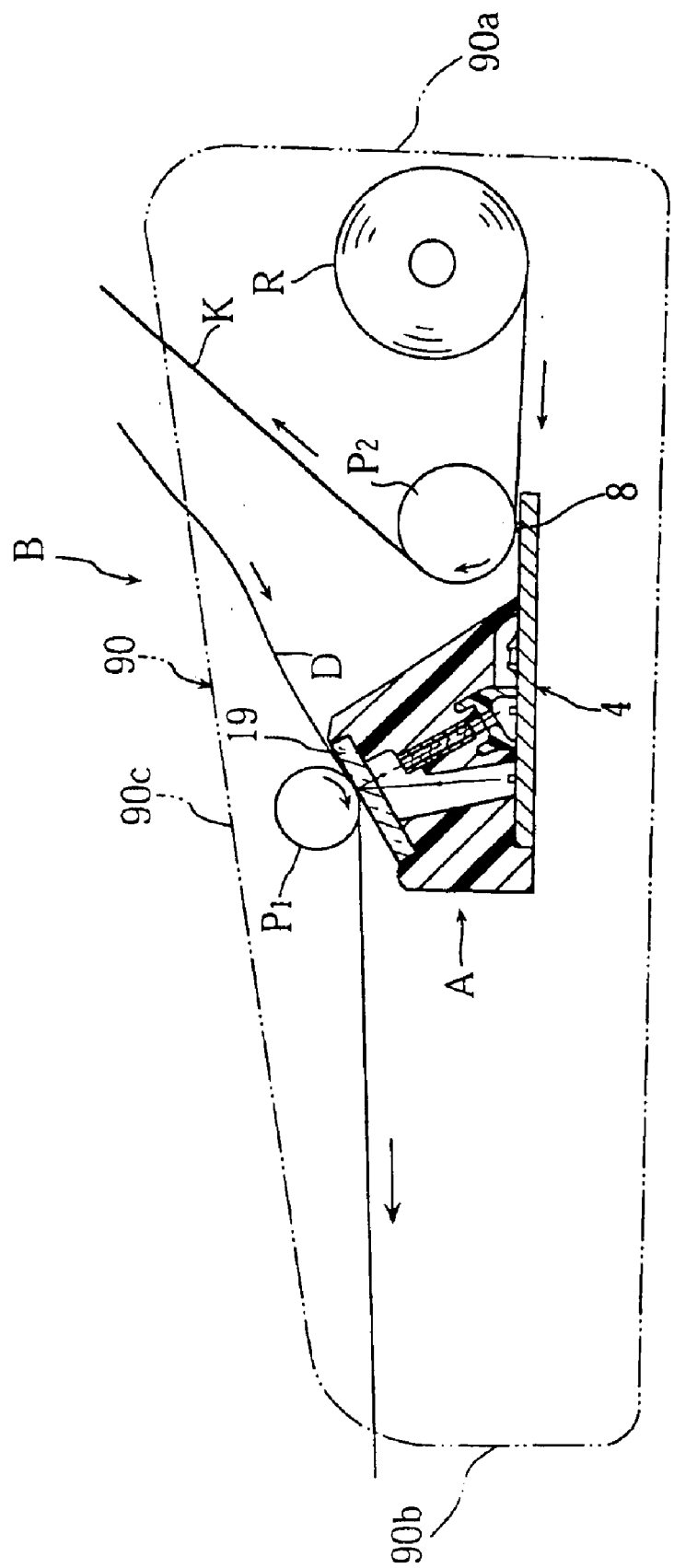
FIG. 9 is a conceptual diagram showing a longitudinal section of an image processing apparatus as a fifth embodiment of the present invention.

Further, according to a fifth embodiment shown FIG. 9, the layout of the platen rollers $P_1$, $P_2$, the roll paper R and the integrated image-reading/writing head A is reversed in terms of a front-rear relationship. (Specifically, FIG. 9 differs from FIG. 7 only in that the box 90 is turned around.) With this arrangement, the roll paper R is disposed closer to the back surface 90a of the box 90 than is the integrated image-reading/writing head A, and each of the platen rollers $P_1$, $P_2$, and the roll paper R rotates in the clockwise direction as in FIG. 9.

With this arrangement, the document D is put for example from an input port adjacent to the discharge port of the recording paper K in the upper surface 90c of the box 90.

The document D is read while passing between the first platen roller $P_1$ and the transparent cover 19, and then discharged from the front surface 90b of the box 90 for example.

On the other hand, the recording paper K is pulled out from the lower side of the roll paper R, formed with an image while passing between the second platen roller $P_2$ and the heating resistor 8, and then discharged from a discharge port closer to the back surface 90a in the upper surface 90c of the box 90.

Obviously, the arrangement may be varied in such a way as according to a sixth embodiment shown in FIG. 10. Specifically, the recording paper K is pulled out from the upper side of the roll paper R, and the second platen roller $P_2$ rotates clockwise as in FIG. 10. With this arrangement, the recording paper K is discharged from the back surface 90a of the upper surface 90c of the box 90 for example.

Figure 11:
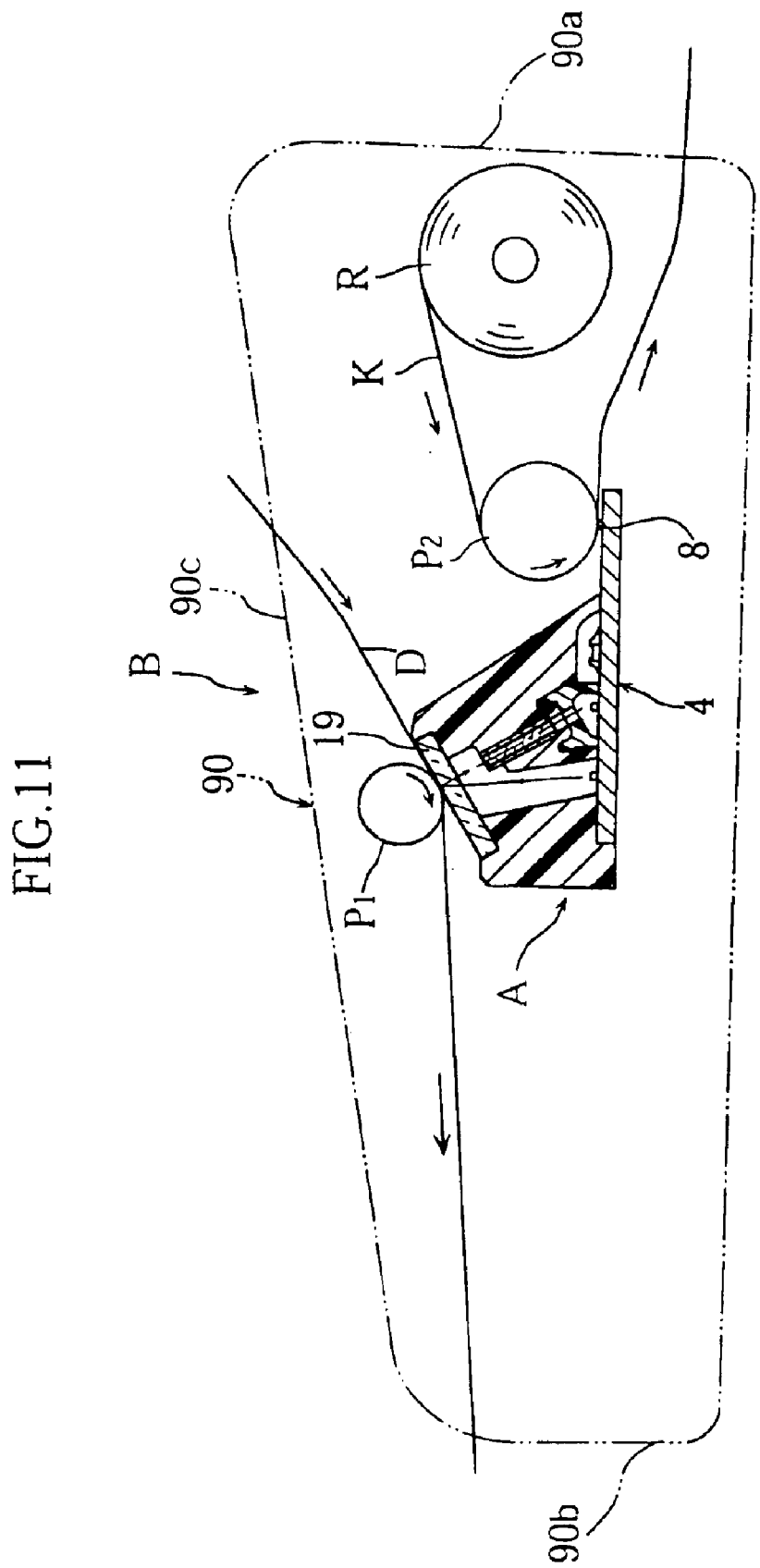
FIG. 11 is a conceptual diagram showing a longitudinal section of an image processing apparatus as a seventh embodiment of the present invention.

Alternatively, arrangement may be as according to a seventh embodiment shown in FIG. 11. Specifically, the recording paper K is pulled out from the upper side of the roll paper R, and the second platen roller $P_2$ rotates counterclockwise as in FIG. 11. With this arrangement, the recording paper K is discharged from the back surface 90a of the box 90 for example.

Figure 12:
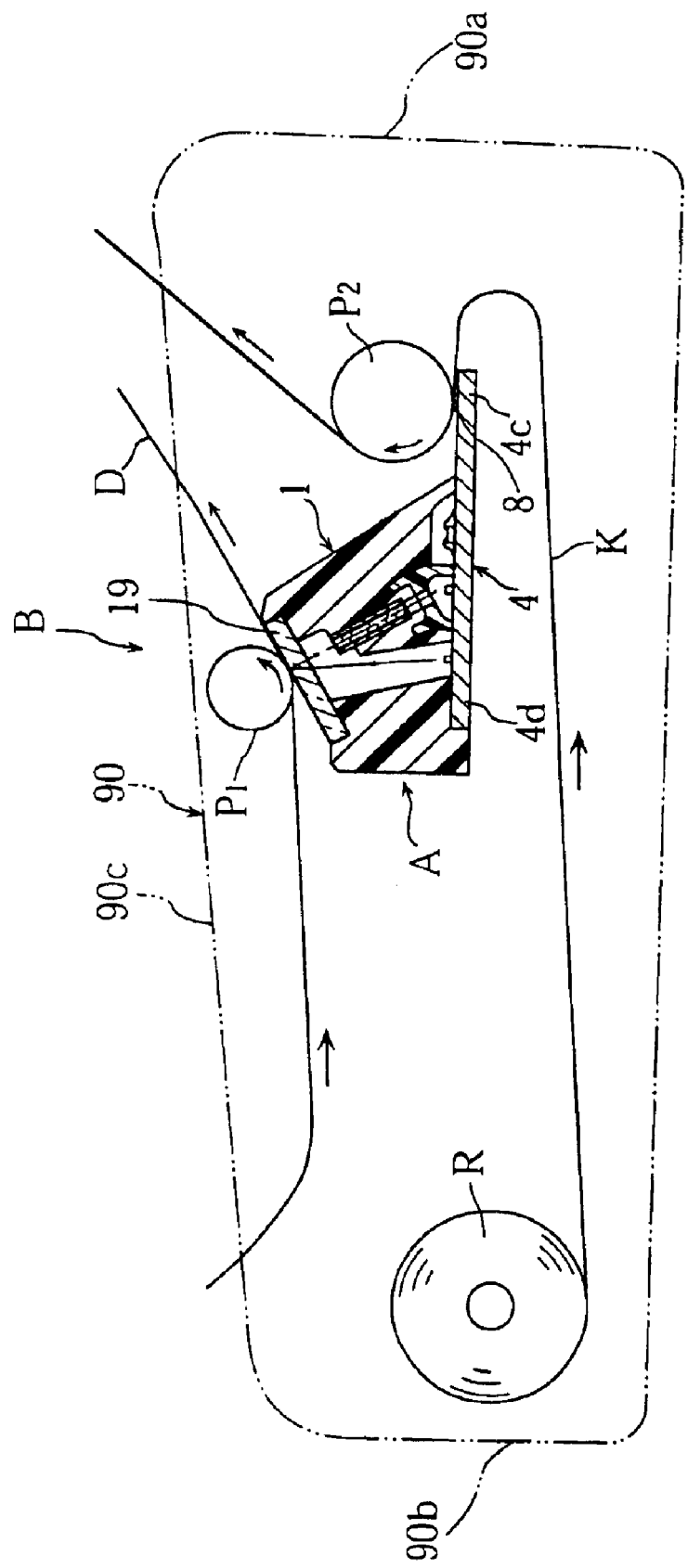
FIG. 12 is a conceptual diagram showing a longitudinal section of an image processing apparatus as an eighth embodiment of the present invention.

Still alternatively, arrangement may be as according to an eighth embodiment shown in FIG. 12. Specifically, the integrated image-reading/writing head A and the roll paper may be disposed relatively apart from each other. More specifically, the roll paper R is disposed closer to the front surface 90b in the box 90 whereas the integrated image-reading/writing head A is incorporated at a center portion or closer to the back surface 90a in such an attitude that the case 1 project above the substrate 4, with the first longitudinal edge portion 4c of the substrate 4 projecting toward the back surface 90a. In this case, the first platen roller $P_1$, and the roll paper R rotate counterclockwise whereas the second platen roller $P_2$ rotates clockwise for example.

With this arrangement, the document D is transported along the upper surface 90c of the box 90, from a port closer to the front portion 90b toward the rear portion 90a for example. On the other hand, the recording paper K is discharged from a port adjacent to the discharge port of the document D for example.

Figure 13:
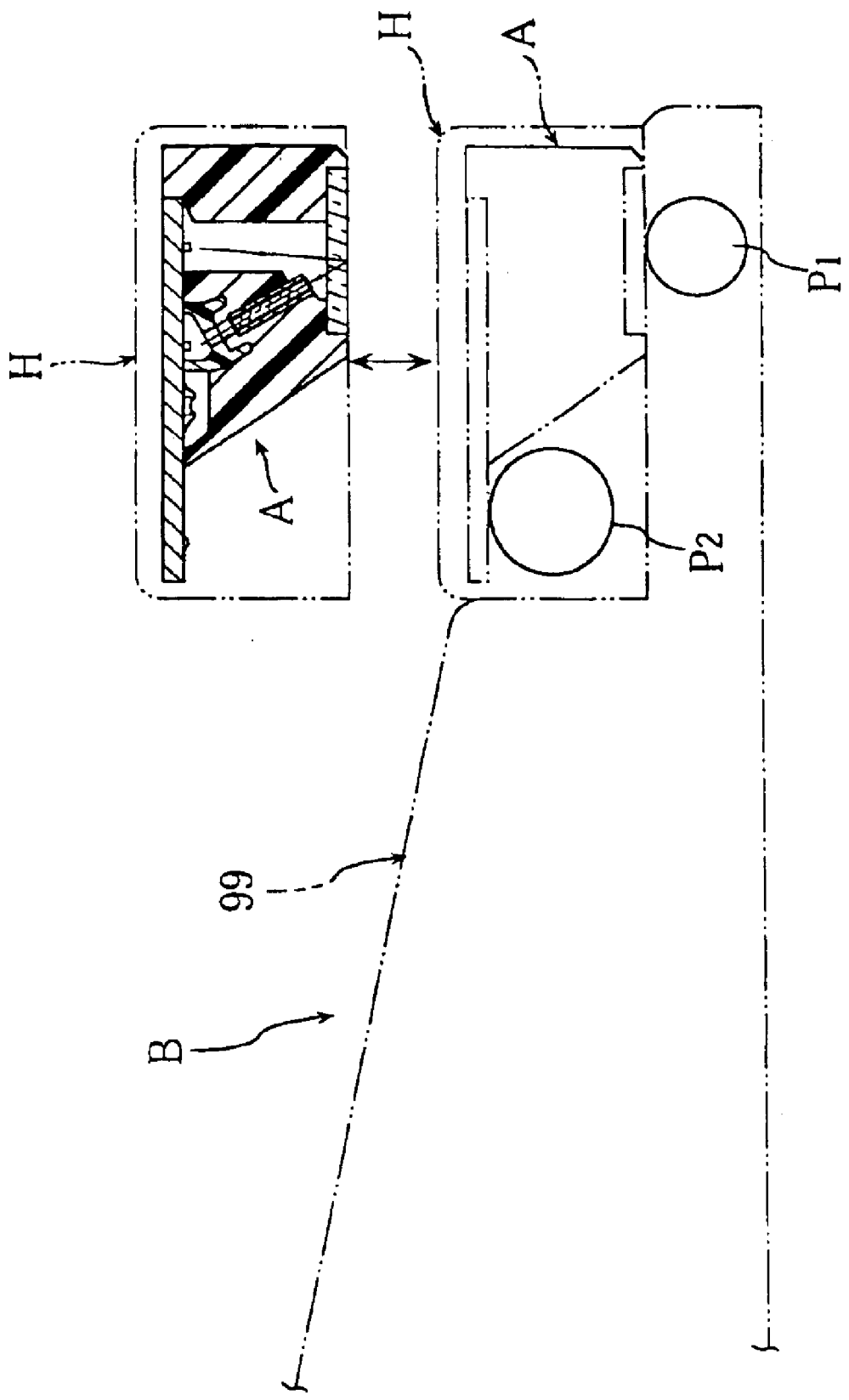
FIG. 13 is a conceptual diagram showing a longitudinal section of an image processing apparatus as a ninth embodiment of the present invention.

Still alternatively, the arrangement may be as according to a ninth embodiment of the image processing apparatus B shown in FIG. 13. Specifically, an image reading portion H is separable from a main body 99. The image reading portion H can also function as a so-called handy scanner detachable from the main body 99. In this case, the integrated image-reading/writing head A is incorporated in the image reading portion H, whereas each of the platen rollers $P_1$, $P_2$ and the roll paper R may be incorporated in the main body 99 or may be incorporated in the image reading portion H (not illustrated).

Figure 14:
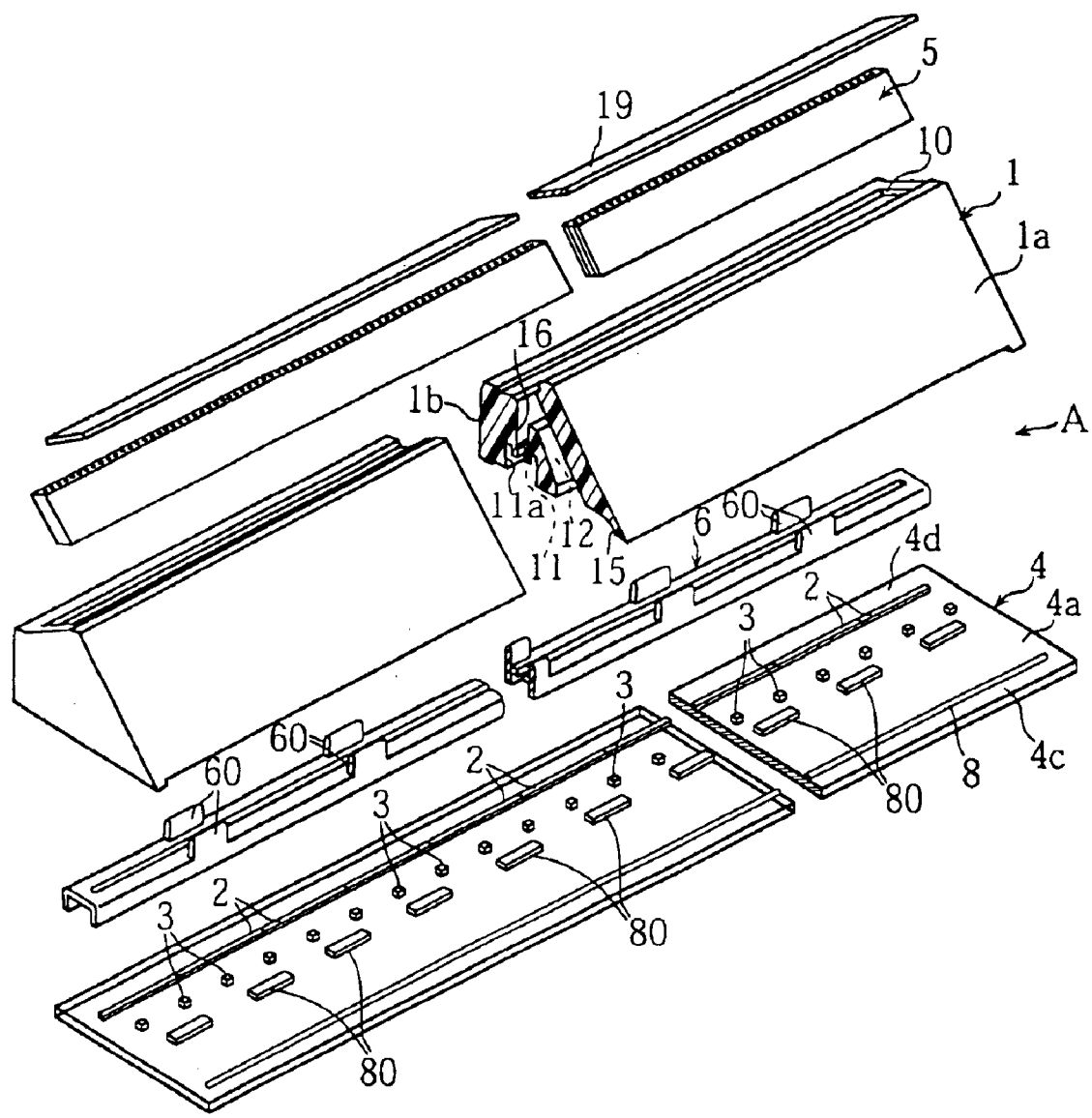
FIG. 14 is an exploded perspective view of an integrated image-reading/writing head as a tenth embodiment of the present invention.
Figure 15:
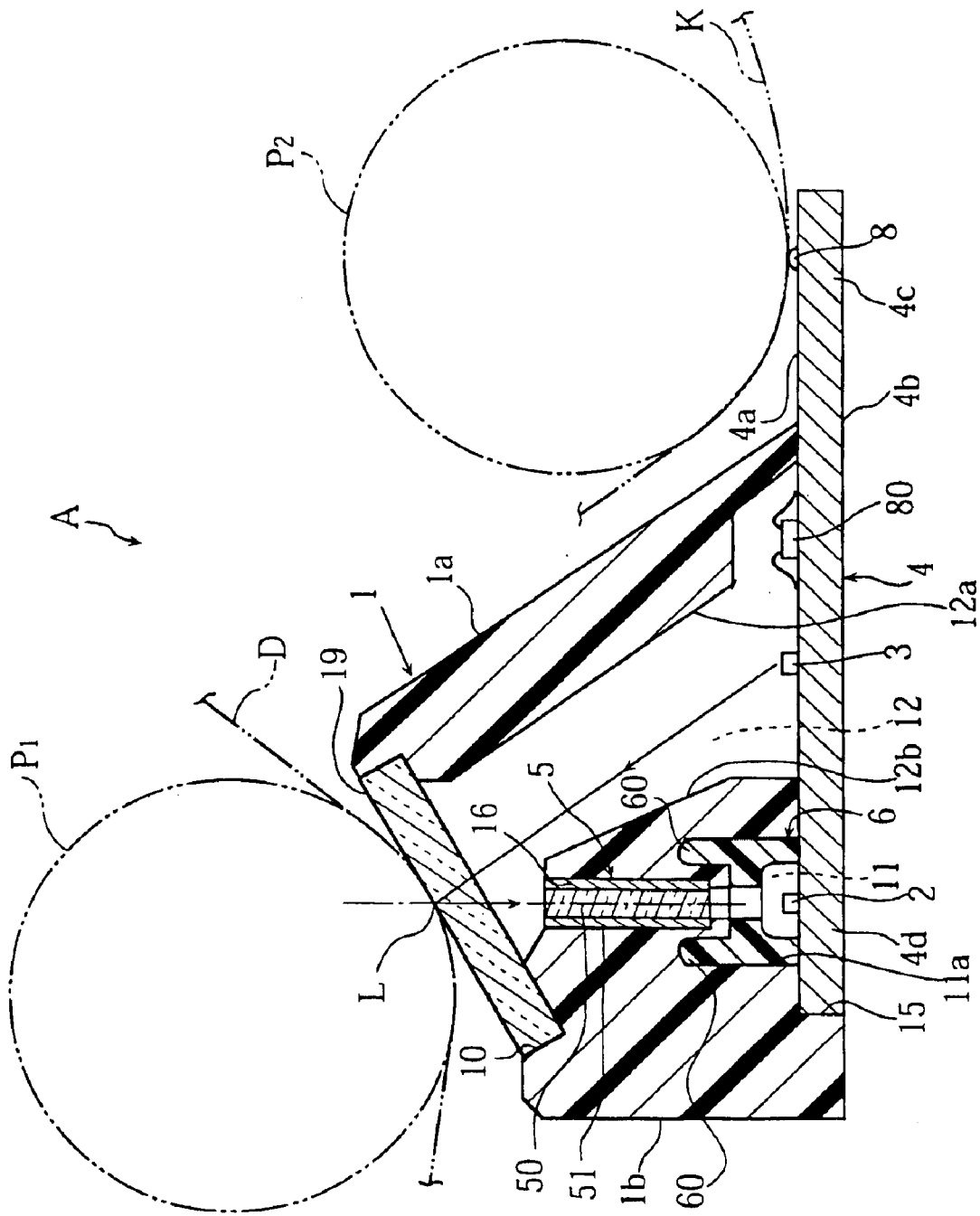
FIG. 15 is a view showing a longitudinal section of the integrated image-reading/writing head in FIG. 14.

FIG. 14 and FIG. 15 show an image processing apparatus as a tenth embodiment of the present invention.

Figure 2:
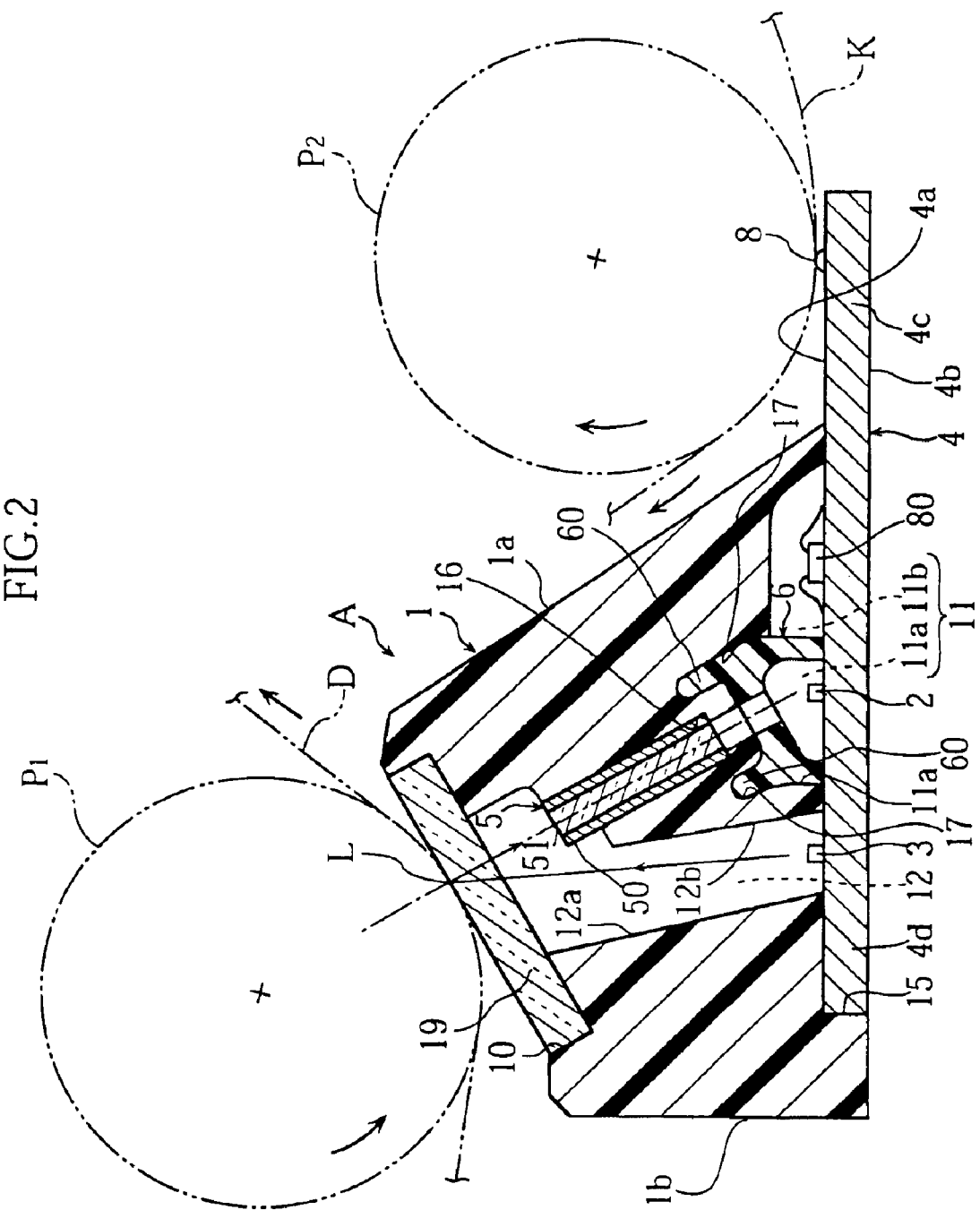
FIG. 2 is a view showing a longitudinal section of the integrated image-reading/writing head in FIG. 1.

An integrated image-reading/writing head A utilized in this embodiment differs from the first embodiment shown in FIG. 1 and FIG. 2 in that location of the light source elements 3 and location of the sensor IC chips 2 in the substrate 4 are swapped. Specifically, in this substrate 4, from the side of the first longitudinal edge portion 4c toward the side of the second longitudinal edge portion 4d, arrays of the heating elements, the drive IC's, the light source elements 3, and the sensor IC chips 2 are laid in this particular order, linearly and longitudinally of the substrate 4.

Again in this arrangement, the case 1 is assembled to the substrate 4, allowing the first longitudinal edge portion 4c of the substrate 4 to extend out of the case 1, and each of the heating elements is mounted on the upper surface 4a of the extended portion of the substrate 4. Further, the other elements are also mounted on the same upper surface 4a of the substrate 4. Therefore, according to this tenth embodiment again, manufacture of the integrated image-reading/writing head A can be simplified, and size reduction can be achieved in the image processing apparatus B incorporating this integrated image-reading/writing head A.

FIG. 16 to FIG. 23 show an image processing apparatus as an eleventh embodiment of the present invention.

Similarly to the tenth embodiment described above, an integrated image-reading/writing head A according to the eleventh embodiment differs from the first embodiment in that location of the light source elements 3 and location of the sensor IC chips 2 in the substrate 4 are swapped. Accordingly, layout and use of the space formed in the case 1 are also different between the first embodiment and the eleventh embodiment, but there are no essential differences. The rest of the arrangement in the eleventh embodiment is identical with that of the first embodiment. Therefore, hereinafter, description will cover primarily differences from the first embodiment, i.e. disposition of the elements in the substrate 4 and wiring patterns in the substrate 4. The members and elements essentially the same as in the first embodiment will be indicated by the same alpha-numeral codes without detailed description.

Figure 16:
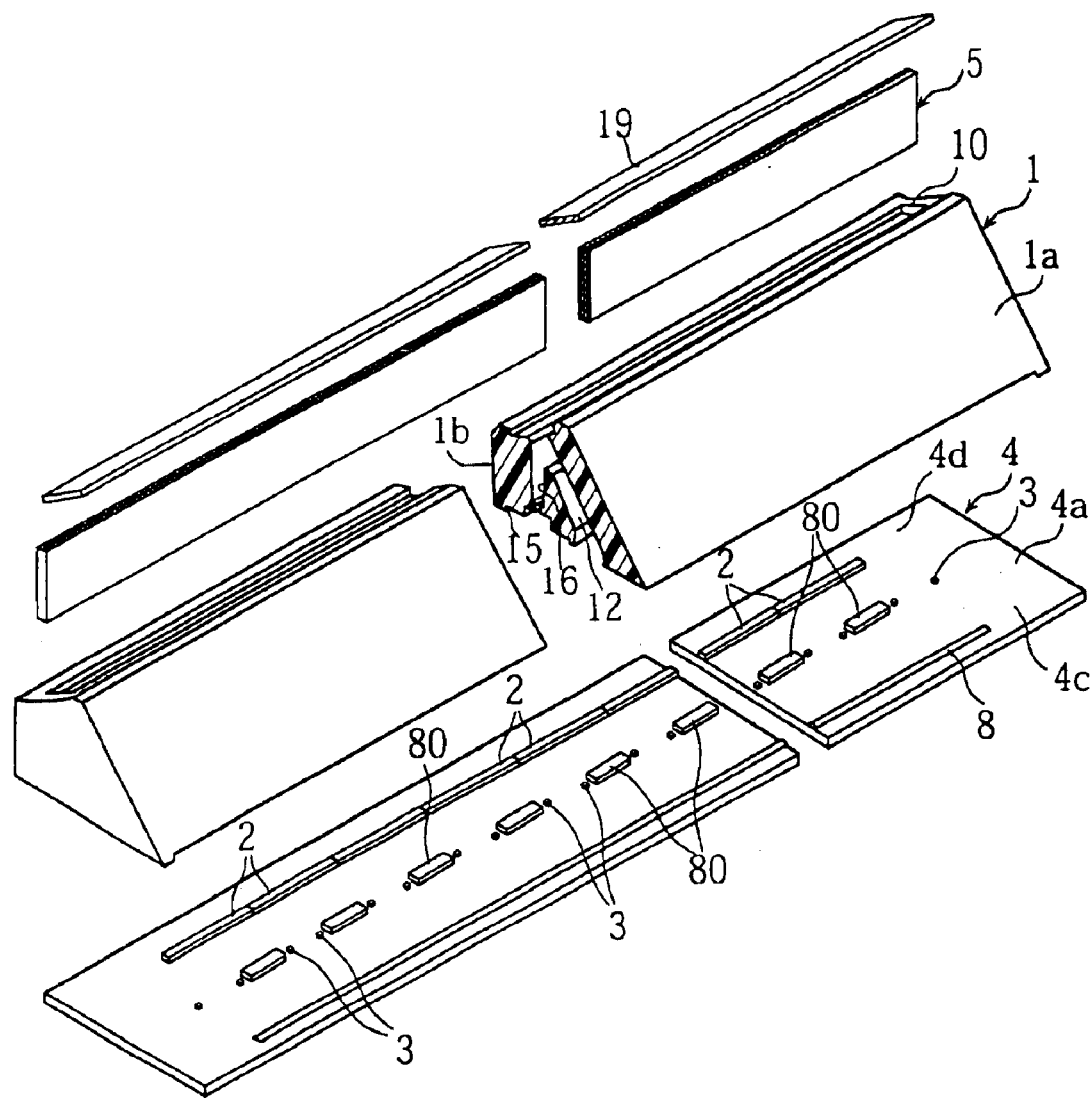
FIG. 16 is an exploded perspective view of an integrated image-reading/writing head as an eleventh embodiment of the present invention.
Figure 17:
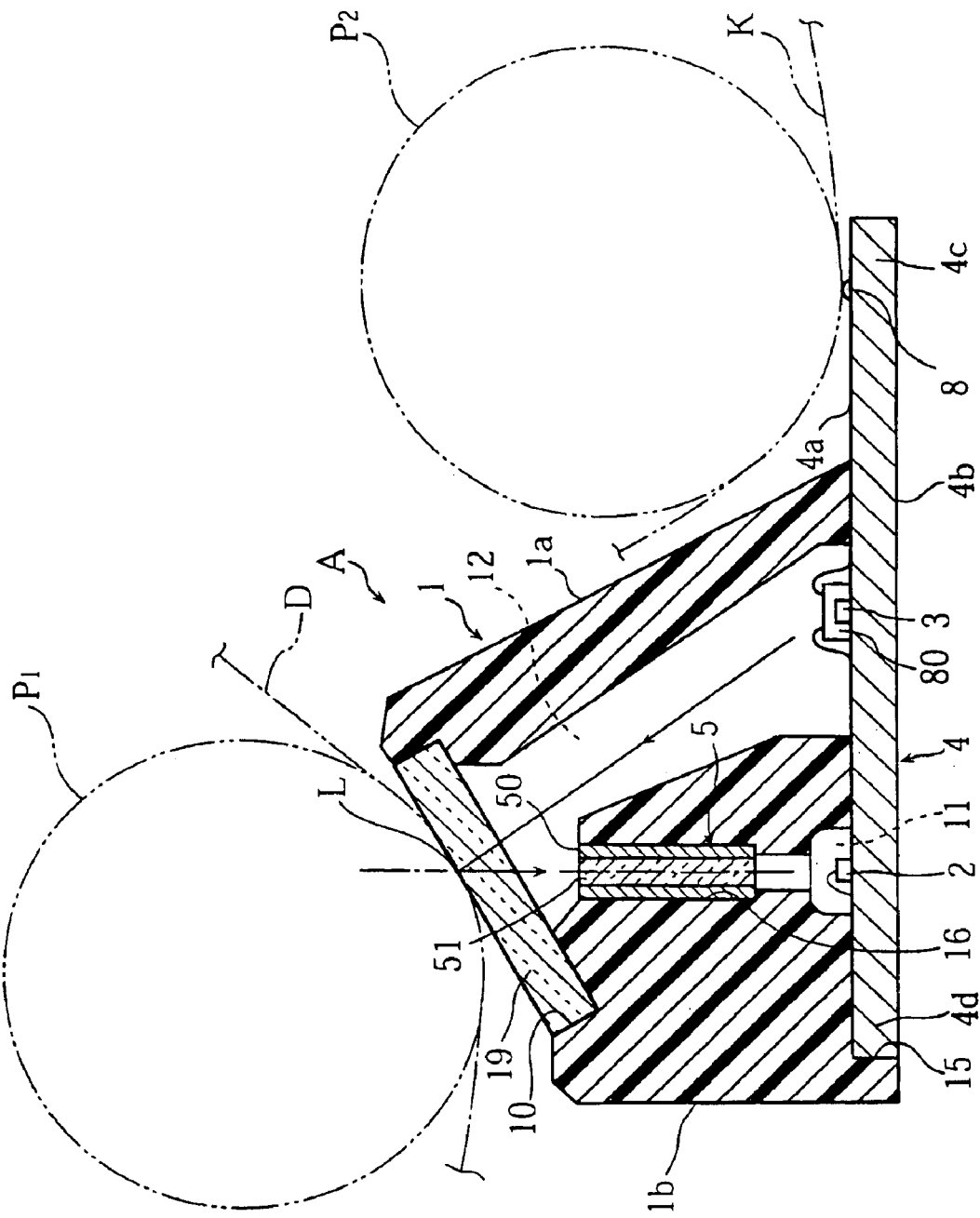
FIG. 17 is a view showing a longitudinal section of the integrated image-reading/writing head in FIG. 16.
Figure 18:
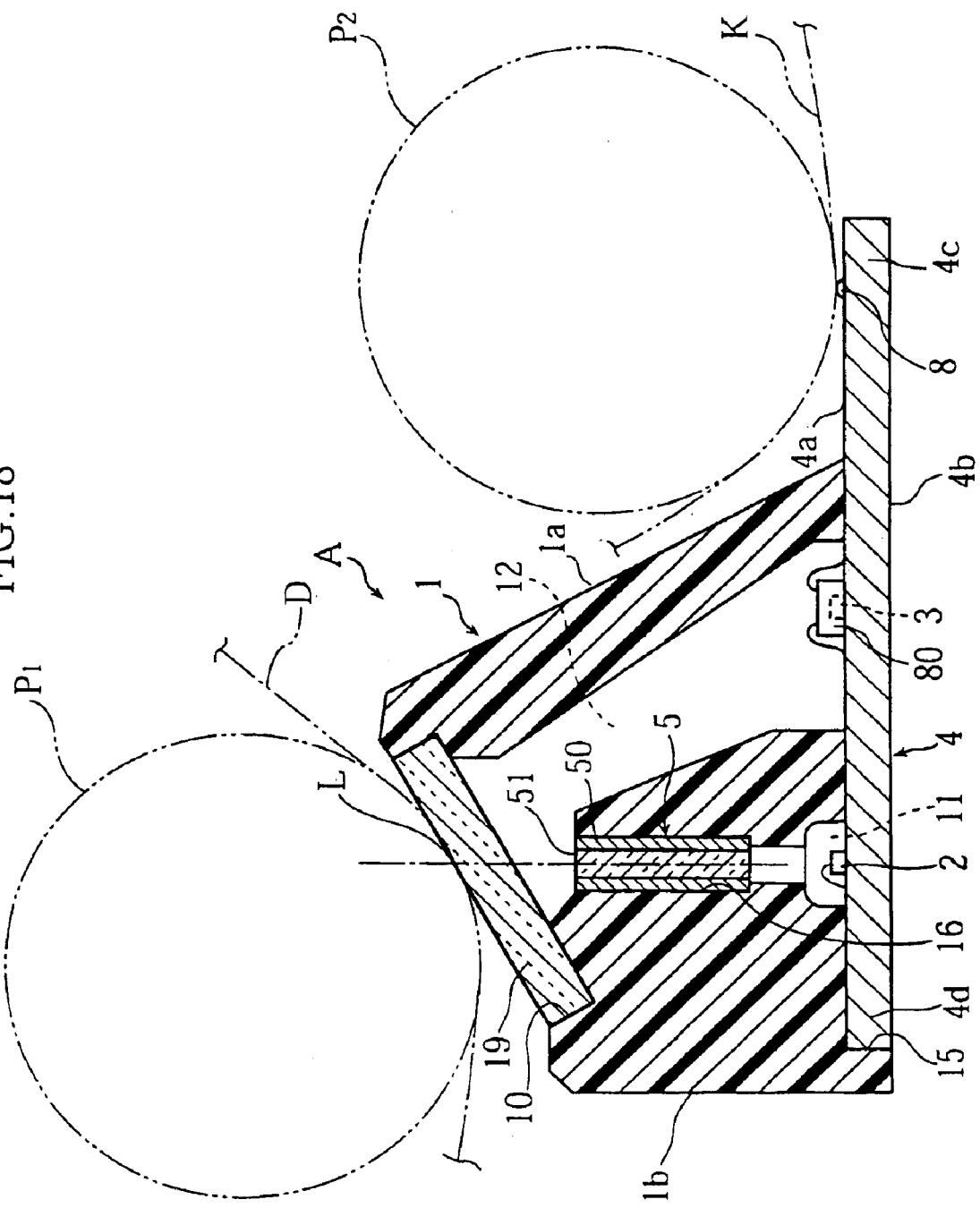
FIG. 18 is a view showing another longitudinal section of the integrated image-reading/writing head in FIG. 16 taken in a cutting line different from a cutting line used for FIG. 17.

As clearly shown in FIG. 16 and FIG. 18, again in the integrated image-reading/writing head A of the eleventh embodiment, the case 1 is assembled to the upper surface 4a of the substrate 4, allowing the first longitudinal edge portion 4c of the substrate 4 to extend out of the case 1.

The upper surface 4a of the substrate 4, of the portion extended out of the case 1, is formed with the heating resistor 8. On the other hand, the second longitudinal edge portion 4d of the substrate 4 is provided with a longitudinal array of the sensor IC chips 2. Between the heating resistor 8 and the array of the sensor IC chips 2, an array of the drive IC's 80 is provided longitudinally of the substrate 4.

Figure 19:
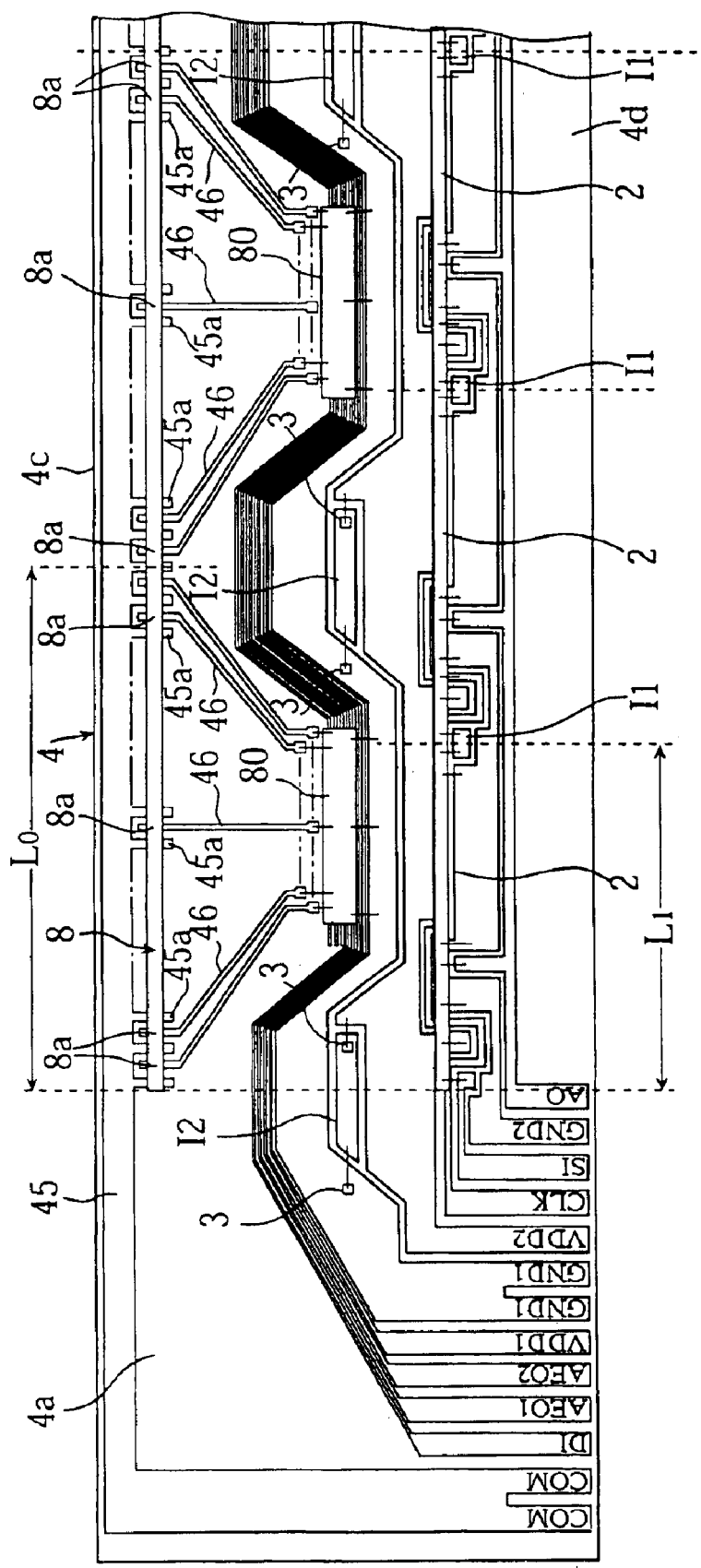
FIG. 19 is a plan view of the integrated image-reading/writing head in FIG. 16, showing a principal portion of a substrate.
Figure 20:
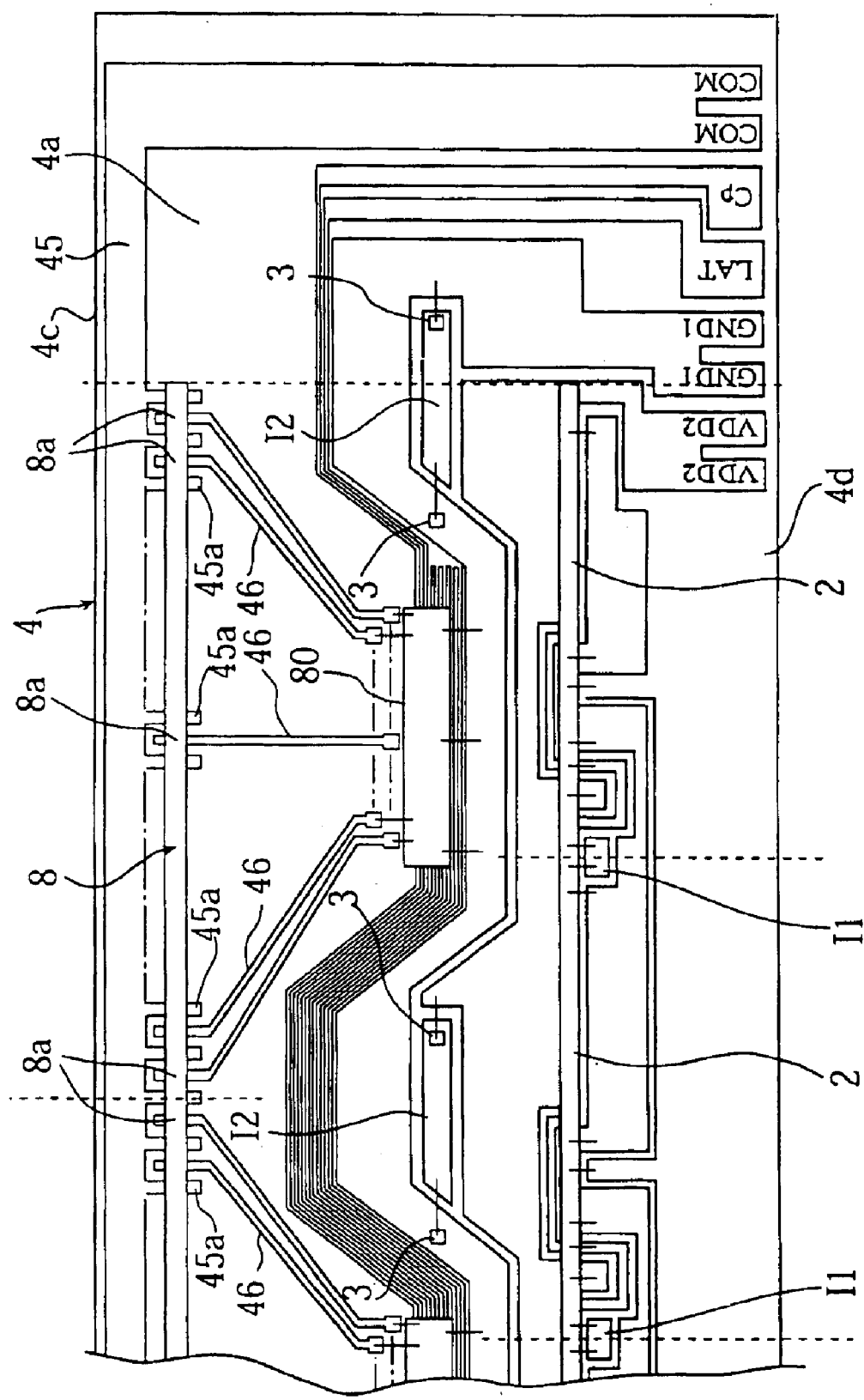
FIG. 20 is a plan view of the integrated image-reading/writing head in FIG. 16, showing another principal portion of the substrate.
Figure 21:
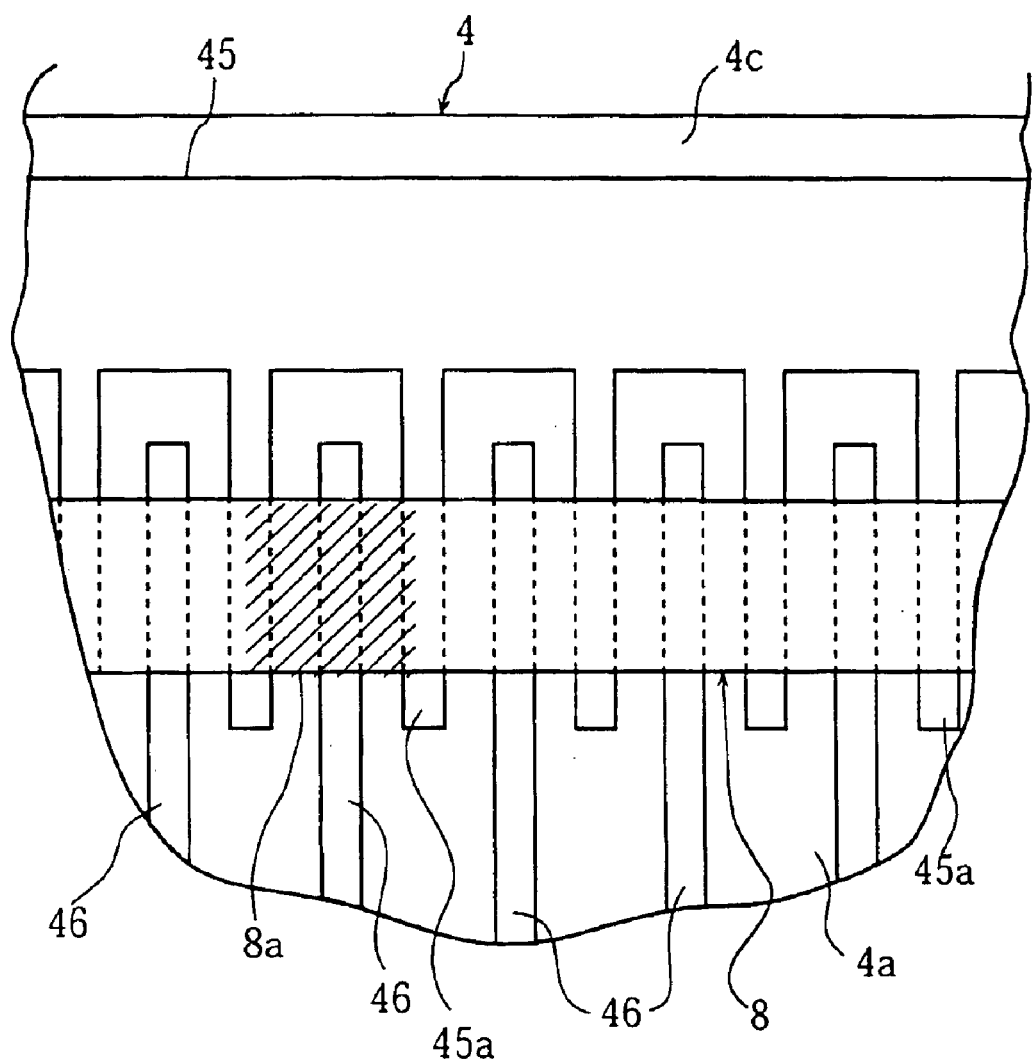
FIG. 21 is an enlarged plan view of the substrate of the integrated image-reading/writing head in FIG. 16, showing a principal portion for description of a heating element mounted on the substrate.

As shown in FIG. 19 to FIG. 21, the heating resistor 8 is electrically divided by a common wiring COM formed in a shape like a letter U as a whole, into a plurality of heating elements 8a formed longitudinally of the substrate 4. More specifically, from a common line 45 extending along the first longitudinal edge portion 4c of the substrate 4, a plurality of common electrode portions 45a are formed at an interval to extend toward the second longitudinal edge portion 4d of the substrate 4. Each of the common electrode portions 45a has a tip portion laid beneath the heating resistor 844, electrically dividing the heating resistor 844. Further, a plurality of individual electrodes 46 are formed in a region between the common line 45 and each of the drive IC's 80 in the substrate 4. Each of these individual electrodes 46 has a tip portion extending between a pair of mutually adjacent common electrode portions 45a and is laid beneath the heating resistor 8 as clearly shown in FIG. 21. On the other hand, each of the individual electrodes 46 has another tip portion extending toward one of the drive IC's 80 as shown in FIG. 19 and FIG. 20.

Each of the drive IC's 80 drives an assigned number of the heating elements 8a disposed within a longitudinal range indicated by alpha-numeral code $L_0$ in FIG. 19. If the integrated image-reading/writing head A is constituted for recording on the recording paper K of size A4 at a reading density of 8 dots/mm, a total of 1728 heating elements 8a must be disposed in a printing width (longitudinally of the substrate 4). If a total of 12 drive IC's are to drive these heating elements 8a, then each of the drive IC's 80 controls 144 heating elements 8a. Thus, the total of 144 individual electrodes 46 are formed from the heating resistor 8 to each of the drive IC's.

Further, as clearly shown in FIG. 19 and FIG. 20, the upper surface 4a of the substrate 4 is formed with wirings serving each of the drive IC's. Specifically, a printing data wiring DI, strobe signal wirings AEO1, AEO2, a power supply wiring VDD1, a grounding wiring GND1, a latch signal wiring LAT, and a clock plus signal wiring Cp. According to the present embodiment, two strobe signal wirings AEO1 and AEO2 are formed. This is to drive two groups of heating elements independently at a different timing. Specifically, half of the heating elements 8a closer to one end of the substrate 4 belong to one group and the other half of the heating elements 8a belong to the other group.

The grounding wiring GND1 is wider than other wirings, generally along the array of the drive IC's 80 while avoiding contact with the drive IC's 80. The grounding wiring GND1 has two ends each disposed at an end portion of the second longitudinal edge portion 4d of the substrate 4, serving as an output pad.

Figure 22:
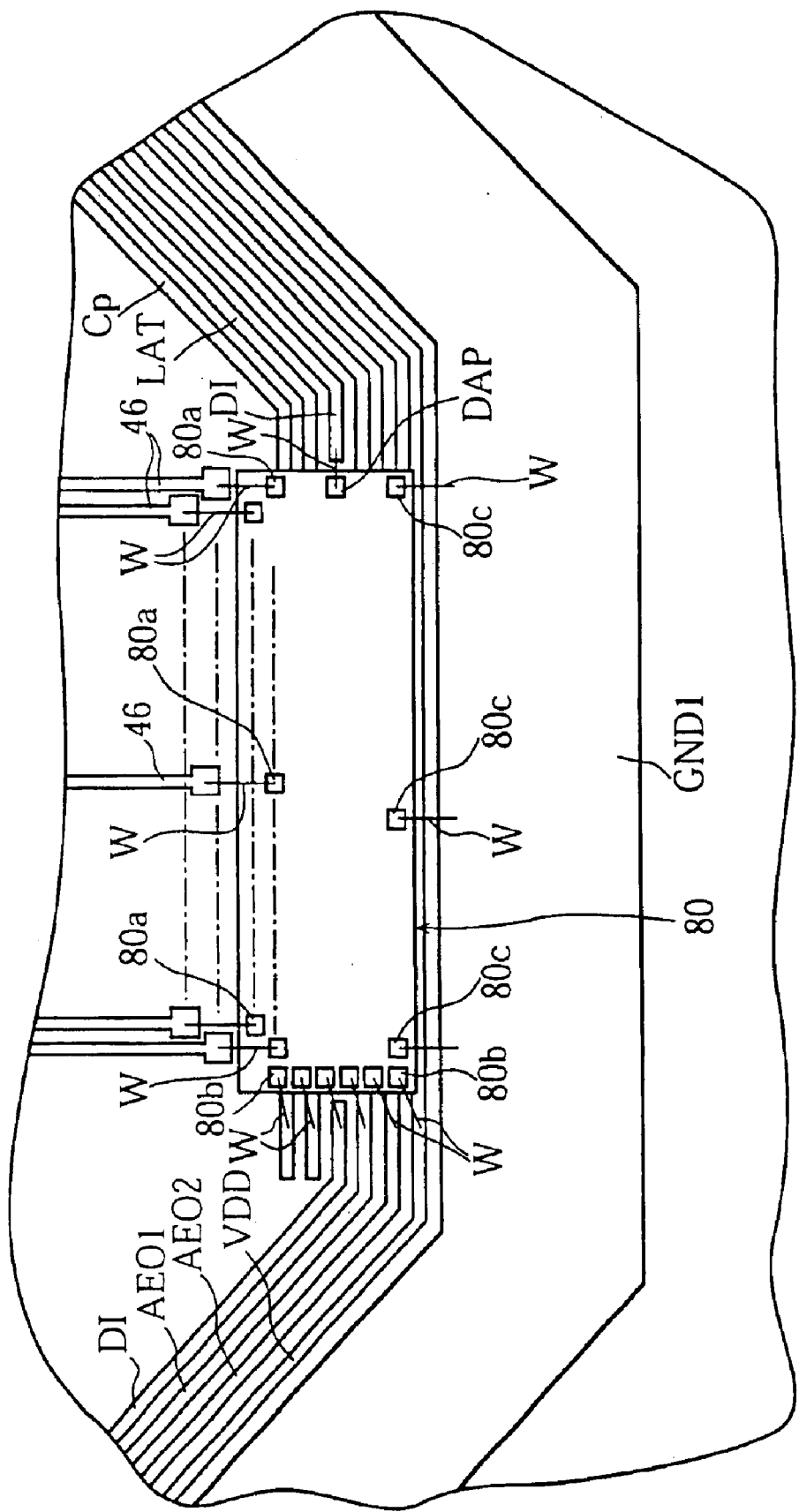
FIG. 22 is an enlarged plan view of the substrate of the integrated image-reading/writing head in FIG. 16, showing a principal portion for description of surroundings of a drive IC mounted on the substrate.

As clearly shown in FIG. 22, the printing data wiring DI is non-continuous, and is not formed in the region mounted with the drive IC 80.

As clearly shown in FIG. 19 and FIG. 20, each of the strobe signal wirings AEO1, AEO2, the power supply wiring VDD1, the latch signal wiring LAT, and the clock plus signal wiring Cp is formed continuously, generally along the grounding wiring GND1. The strobe signal wirings AEO1, AEO2 and the power supply wiring VDD1 have their respective input pads formed in one end portion (left-hand side in FIG. 19) of the second longitudinal edge portion 4d of the substrate 4. The latching signal wiring LAT and the clock pulse signal wiring Cp have their respective input pads formed in the other end portion (right-hand side in FIG. 19) of the second longitudinal edge portion 4d of the substrate 4.

As shown in FIG. 22, each of the drive IC's 80 has four sides formed with a plurality of terminal pads 80a, 80b, 80c, and DAP. Each of the terminal pads 80a formed along an upper side, as in FIG. 22, of the drive IC 80 is electrically connected to one of the individual electrodes 45 via a wire W, and there is formed a total of 144 of such terminal pads for example corresponding to the number of the individual electrodes 45. Each of the terminal pads 80b formed along a left side, as in FIG. 22, of the drive IC 80 is electrically connected to one of the wirings for the drive IC's 80 via a wire W, and there is formed a total of six such terminal pads for example corresponding to the number of the wirings. Each of the terminal pads 80c formed along a lower side, as in FIG. 22, of the drive IC 80 is electrically connected to the grounding wiring GND1 via a wire W. Further, the terminal pad DAP formed near a right side, as in FIG. 22, of the drive IC 80 is for outputting the printing data from the drive IC's 80, and is connected to the printing data wiring DI formed in a region facing the adjacent drive IC 80 via a wire W. As will be understood, each of the drive IC's 80 is electrically connected in parallel to the corresponding one of the strobe signal wirings AEO1, AEO2, the power supply wiring VDD1, the grounding wiring GND1, the latch signal wiring LAT, and the clock pulse signal wiring Cp. On the other hand, each of the drive IC's 80 is electrically connected in series to the printing data wiring DI.

The drive IC's, the heating resistors 8 and the relevant wirings are components essential to the image formation in the recording paper K. Each of the drive IC's incorporates various unillustrated subcomponents such as transistors, and each of the transistors can be driven by electric power supplied via the power supply wiring VDD1. For example, when a printing data for one line is sent from the printing data wiring DI, the printing data is sequentially forwarded to each of the bits in a shift register (not illustrated) within each of the drive IC's 80 in synchronization with the clock pulse signal supplied from the clock pulse signal wiring Cp. The forwarding continues until the bit of the printing data inputted first into the drive IC at the first stage (left end in FIG. 19) is held in the last bit of the shift register of the drive IC 80 at the last stage (right end in FIG. 20). Then, the latch signal supplied from the latch signal wiring LAT to each of the drive IC's 80 is inputted, thereupon the data held in each of the shift registers is stored in each of the latch circuit (not illustrated) in each of the drive IC's 80. The strobe signal wiring AEO1 supplies a strobe signal to each of the drive IC's 80 electrically connected to this strobe signal wiring AEO1. While this strobe signal is being supplied, the transistors each related to one of the individual electrodes 46 are turned on or off corresponding to the dot data stored in the latch circuit in each of the drive IC's 80, applying electric current only to the selected individual electrodes 46. With a certain time lag from the strobe signal from the strobe signal wiring AEO1, another strobe signal is supplied to each of the drive IC's 80 connected to the strobe signal wiring AEO2. While this strobe signal is being supplied, selected heating elements 8a are heated in the same manner as described above, completing the line of printing.

Each of the sensor IC chips 2 incorporates a plurality of light receiving elements such as phototransistors. A longitudinal range indicated by an alpha-numeral code $L_1$ represents one of the chips. As has been described for the first embodiment, if the integrated image-reading/writing head A is constituted to read the document D of size A4 at a reading density of 8 dots/mm, a total of 96 light receiving elements for example is formed within each of the sensor IC chips 2, and a total of 18 sensor IC chips 2 are mounted on the substrate 4.

Further, as shown in FIG. 19 and FIG. 20, the upper surface 4a of the substrate 4 is formed with wirings for each of the sensor IC chips 2, i.e. an analog data output wiring AO, a grounding wiring GND2, a serial signal wiring SI, a clock signal wiring CLK, and a power supply wiring VDD2.

Figure 23:
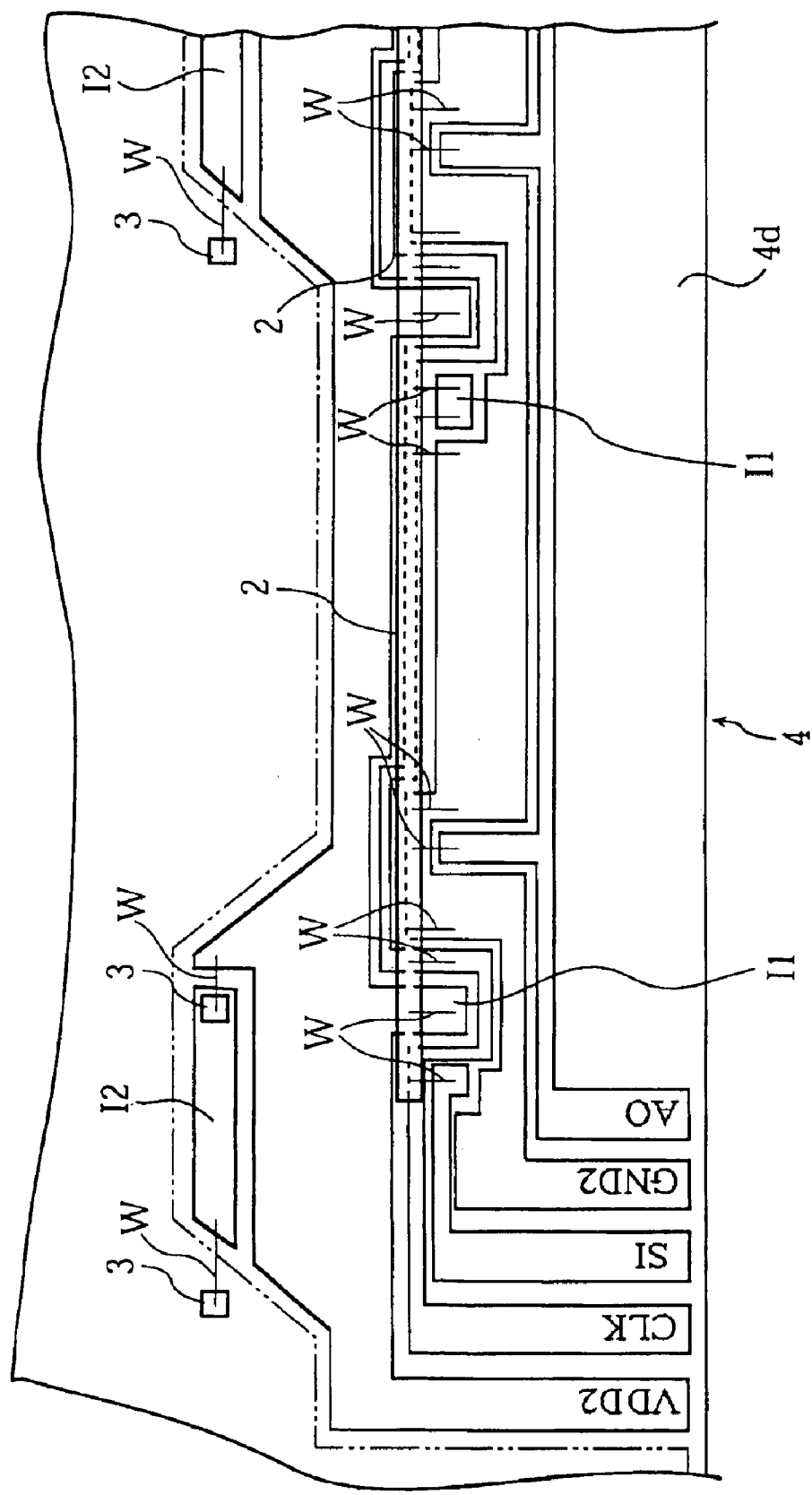
FIG. 23 is an enlarged plan view of the substrate of the integrated image-reading/writing head in FIG. 16, showing a principal portion for description of a wiring pattern formed in the substrate.
Figure 24:
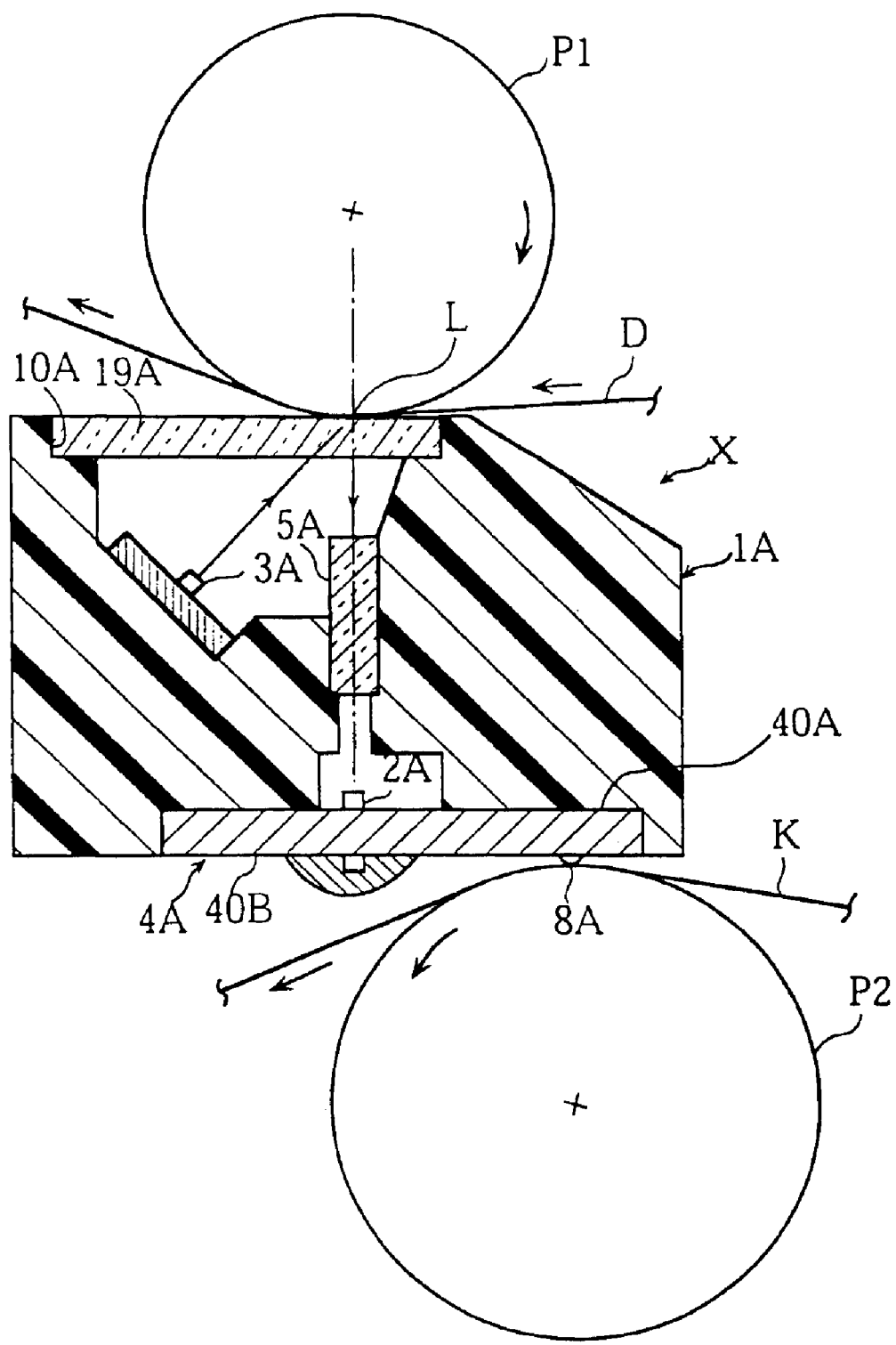
FIG. 24 is view showing a longitudinal section of a prior art integrated image-reading/writing head.

As shown in FIG. 19 and FIG. 23, the power supply wiring VDD2 is formed continuously and along the grounding wiring GND1 for the drive IC's, generally in parallel to the grounding wiring GND1. Each of the analog data output wiring AO, the grounding wiring GND2, the clock signal wiring CLK, and the power supply wiring VDD2 is connected to each of the sensor IC chips 2 via a wire W. Through this connection, each of the sensor IC chips 2 is electrically connected in parallel to the analog data output wiring AO, the grounding wiring GND2, the clock signal wiring CLK, and the power supply wiring VDD2.

The serial signal wiring SI, is formed non-continuously, and is connected to the sensor IC chip 2 at the first stage (left end in FIG. 19) via a wire W. An island-like electrically conductive region I1 is formed closely to and between each adjacent pair of the sensor IC chips 2, and is connected to each of the adjacent sensor IC chips 2 via a wire W, making possible to sequentially transfer a serial signal from the sensor IC chip 2 on the left side of the FIG. 19 to the sensor IC chip 2 on the right side of the FIG. 19.

The sensor IC chip 2 incorporates therein various unillustrated transistors driven by the power supplied from the power supply wiring VDD2 to the sensor IC chip 2. According to this sensor IC chip 2, when the light receiving elements receive the reflected light from the document D, the read data having an output level corresponding to the amount of light received is first held at each of the light receiving element. Then, when a serial signal is supplied from the serial signal wiring SI to the sensor IC chip at the first stage, the transistors (not illustrated) each serving as an analog switch is turned on, and the read data held by the light receiving elements at the first stage is released as an analog signal to the analog data output wiring AO. Then, in synchronization with the clock signal supplied from the clock signal wiring CLK, the sensor IC chip 2 sequentially forwards each of the bits in the shift register (not illustrated) as the serial signal. The read data held in each of the light receiving elements is sequentially outputted, until the serial signal is forwarded to the last bit of the shift register in the sensor IC chip 2 at the last stage (right end of FIG. 20), when complete read data for one line is obtained.

Further, on the upper surface 4a of the substrate 4, a plurality of light source elements 3 are mounted on a straight line generally identical with the straight line defined by the array of the drive IC's 80. These light source elements 3 are disposed as pairs of two light source elements 3 electrically connected in series with each other. For example, one such pair is disposed in each region between two mutually adjacent drive IC's 80. Further, a pair of the light source elements 3 is disposed in a region of the substrate 4 outward of the endmost drive IC 80 at each of the end portions (the left end of FIG. 19 and the right end of FIG. 20).

In each pair of the light source elements 3, one of the light source elements 3 is mounted on an electrically conductive region 12 formed between the grounding wiring GND1 and the power supply wiring VDD2 for the sensor IC chips 2, and connected to the power supply wiring VDD2 for the sensor IC chips 2 via a wire W for illumination by the power from the power supply wiring VDD2. In other words, each of the light source elements 3 and the sensor IC chips 2 share the power supply wiring VDD2. The other light source element 3 of the pair is mounted on the grounding wiring GND1 and connected with the electrically conductive region 12 via a wire W. In other words, one of the light source element 3 and the other light source element 3 of the pair are electrically connected in series. According to the integrated image-reading/writing head with the above described arrangement, image reading operation and image forming operation are performed in the same way as in the first embodiment.

According to the above integrated image-reading/writing head A, since the light source elements 3 and the sensor IC chips 2 share the power supply wiring VDD2, the width of the substrate 4 can be reduced by simplifying the wiring formed in the substrate 4.

Further, most of the light source elements 3 are mounted between the grounding wiring GND1 for the drive IC's 80 and the power supply wiring VDD2 for the sensor IC chips 2 in the substrate 4. Since these wirings are wider than other signal wirings, by slightly narrowing a width of these wirings, it also becomes possible to reserve a region for mounting the light source elements 3 in the upper surface 4a of the substrate 4. Specifically, the light source elements 3 may not necessarily be mounted on a separate substrate, but can be mounted together with the sensor IC chips 2 and other components on the same upper surface 4a of the same substrate 4, without increasing the size of the substrate 4.

Further, a part of the light source elements 3 are directly mounted onto the grounding wiring GND1 in the substrate 4. This arrangement offers an advantage that no regions may be reserved in the upper surface 4a of the substrate 4 for the mounting of these light source elements 3.

What is claimed is:

1. An integrated image-reading/writing head comprising:

an oblong rectangular substrate having a first longitudinal edge portion, a second longitudinal edge portion and a surface mounted with an array of light receiving elements;

an oblong case mounted on said surface, enclosing the light receiving elements;

a transparent cover attached to the case, facing the substrate and tightly contacted by a document being fed;

a light source disposed within the case for illuminating the document;

a lens disposed within the case for focusing an image of the document illuminated by the light source on the light receiving elements;

an array of heating elements mounted on the substrate; and a plurality of drive IC's each driving a predetermined number of the heating elements; characterized in that the first longitudinal edge portion is extended out of the case by a predetermined width; and that the heating elements being mounted on a region of said surface extended out of the case.

2. The integrated image-reading/writing head according to claim 1, wherein the light source is mounted on said surface.

3. The integrated image-reading/writing head according to claim 2, wherein the light source is mounted closer to a longitudinal edge of the second longitudinal edge portion than is the array of the light receiving elements in said surface.

4. The integrated image-reading/writing head according to the claim 2, wherein the light source is mounted between the array of the heating elements and the array of the light receiving elements in said surface.

5. The integrated image-reading/writing head according to claim 2, wherein the drive IC's are mounted on said surface at an interval in an array extending longitudinally of the substrate.

6. The integrated image-reading/writing head according to claim 5, wherein the light source includes a plurality of light source elements.

7. The integrated image-reading/writing head according to claim 6, wherein apart of the light source elements are mounted in each of the intervals between the drive IC's in said surface.

8. The integrated image-reading/writing head according to claim 6, wherein two or more of the light source elements are mounted in each of the intervals between the drive IC 's in said surface, the two or more of the light source elements being connected electrically in series.

9. The integrated image-reading/writing head according to claim 6, wherein said surface is formed with a power supply wiring pattern for supply of electric power to each of the light receiving elements and the light source.

10. The integrated image-reading/writing head according to claim 9, wherein the power supply wiring pattern formed on said surface extends longitudinally of the substrate along the array of the light receiving elements, said surface being further formed with a grounding wiring pattern for the drive IC's longitudinally of the substrate along the power supply wiring pattern, and wherein at least a part of the light source elements being mounted on a region between the power supply wiring pattern and the grounding wiring pattern.

11. The integrated image-reading/writing head according to claim 10, wherein at least a part of the light source elements is mounted directly on the grounding wiring.

12. An image processing apparatus comprising:

the integrated image-reading/writing head according to claim 1;

a first platen roller pressing the transparent cover and feeding the document under tight contact onto the transparent cover; and a second roller pressing the array of the heating elements and feeding a recording paper under tight contact onto the array of the heating elements.

13. The image processing apparatus according to claim 12, wherein the integrated image-reading/writing head is incorporated in a predetermined box.

14. The image processing apparatus according to claim 13, wherein the box is formed with an opening for exposure of inside of the box, and a lid member capable of closing the opening.

15. The image processing apparatus according to claim 14, wherein the opening exposes the integrated image-reading/writing head when opened, the integrated image-reading/writing head being pivotable about an axis extending longitudinally of the substrate.

16. The image processing apparatus according to claim 15, wherein the axis is provided by a rotating shaft of the second platen roller.

17. The image processing apparatus according to claim 16, wherein the first longitudinal edge portion of the substrate is provided with retaining means having an insertion portion projecting toward the second platen roller and loosely holding the rotating shaft of the second platen roller.

18. The image processing apparatus according to claim 14, further comprising pressing force adjusting means adjusting each of a pressing force of the first platen roller onto the transparent cover and a pressing force of the second platen roller onto the heating elements when the opening is closed.

19. The image processing apparatus according to claim 18, wherein the pressing force adjusting means includes a pressing member pressing the substrate to the first platen roller and the second platen roller.

20. The image processing apparatus according to claim 19, wherein two of the pressing members are disposed widthwise of the substrate for pressing each of the first longitudinal edge portion and the second longitudinal edge portion of the substrate.

21. The image processing apparatus according to claim 19, wherein only one of the pressing member is disposed widthwise of the substrate for pressing a predetermined region of the substrate for distribution of the pressing force to each of the longitudinal edges of the substrate at a desired ratio.

22. The image processing apparatus according to claim 19, wherein the pressing member is made of an elastic member.

23. The image processing apparatus according to claim 14, wherein the integrated image-reading/writing head is attached to the lid member.

* * * * *